(12) United States Patent
Chono

(10) Patent No.: US 8,396,311 B2
(45) Date of Patent: Mar. 12, 2013

(54) IMAGE ENCODING APPARATUS, IMAGE ENCODING METHOD, AND IMAGE ENCODING PROGRAM

(75) Inventor: Keiichi Chono, Tokyo (JP)

(73) Assignee: NEC Corporation, Tokyo (JP)

( * ) Notice: Subject to any disclaimer, the term of this patent is extended or adjusted under 35 U.S.C. 154(b) by 592 days.

(21) Appl. No.: 12/601,484

(22) PCT Filed: Apr. 28, 2008

(86) PCT No.: PCT/JP2008/058166
§ 371 (c)(1),
(2), (4) Date: Nov. 23, 2009

(87) PCT Pub. No.: WO2008/142956
PCT Pub. Date: Nov. 27, 2008

(65) Prior Publication Data
US 2010/0172593 A1    Jul. 8, 2010

(30) Foreign Application Priority Data

May 21, 2007 (JP) .................................. 2007-134162

(51) Int. Cl.
*G06K 9/46* (2006.01)
*G06K 9/36* (2006.01)
(52) U.S. Cl. ................... 382/239; 382/246; 382/247
(58) Field of Classification Search .................. None
See application file for complete search history.

(56) References Cited

U.S. PATENT DOCUMENTS

| | | | | |
|---|---|---|---|---|
| 5,574,449 | A * | 11/1996 | Golin | 341/65 |
| 5,654,702 | A | 8/1997 | Ran | |
| 5,774,081 | A * | 6/1998 | Cheng et al. | 341/107 |
| 6,856,701 | B2 * | 2/2005 | Karczewicz et al. | 382/247 |
| 6,987,468 | B1 * | 1/2006 | Malvar | 341/59 |
| 7,525,456 | B2 * | 4/2009 | Watanabe | 341/51 |
| 2005/0249289 | A1 | 11/2005 | Yagasaki et al. | |
| 2006/0104530 | A1 | 5/2006 | Smirnov | |
| 2006/0176953 | A1 * | 8/2006 | Mohsenian | 375/240.03 |
| 2006/0232452 | A1 | 10/2006 | Cha | |

(Continued)

FOREIGN PATENT DOCUMENTS

| | | |
|---|---|---|
| JP | 2004135251 A | 4/2004 |
| JP | 2007088678 A | 4/2007 |

(Continued)

OTHER PUBLICATIONS

Zhang et al., "High-Performance CABAC Engine for H.264/AVC High Definition Real-Time Decoding", ICCE 2007, Digest of Technical Papers. International Conference on Consumer Electronics, Jan. 10-14, 2007. Las Vegas, NV.*

(Continued)

*Primary Examiner* — Wenpeng Chen
*Assistant Examiner* — Feng Niu

(57) ABSTRACT

An image encoding apparatus, an image encoding method, and an image encoding program capable of minimizing image degradation, controlling a code amount in units smaller than a picture, and ensuring that encoding of the picture is completed within a certain time period is provided. A symbol number estimating device estimates the total bin number of a plurality of macro blocks constituting a picture. An entropy encoding selector outputs the entropy encoding mode selecting signal to an entropy encoder using the inputted bin number, in order to select one of a CABAC device or a VLC device. A CPU performs image encoding by executing a control program stored in a program storing portion.

12 Claims, 12 Drawing Sheets

U.S. PATENT DOCUMENTS

2007/0040708 A1* 2/2007 Senda .............................. 341/50
2007/0116370 A1* 5/2007 Smirnov ........................ 382/245
2008/0112489 A1* 5/2008 Malladi et al. ........... 375/240.22

FOREIGN PATENT DOCUMENTS

| | | |
|---|---|---|
| JP | 2008131140 A | 6/2008 |
| WO | 2004034330 A | 4/2004 |

OTHER PUBLICATIONS

ISO/IEC 14496-10 "Information technology—Coding of audio-visual objects—Part 10: Advanced Video Coding", Fifth edition, May 15, 2009.

E. Viscito, "Macroblock level limit on the number of binary symbols in CABAC", Joint Video Team (JVT) of ISO/IEC MPEG & ITU-T VCEG (ISO/IEC JTC1/SC29/WG11 and ITU-T SG16 Q.6), XP030005623, Dec. 2002.

C. Gomila et al., "New features and applications of the H.264 video coding standard", Information Technology: Research and Education, IEEE, 2003, pp. 6-10.

D. Marpe et al., "Context-Based Adaptive Binary Arithmetic Coding in the H.264/AVC Video Compression Standard", IEEE Transactions on Circuits and Systems for Video Technology, vol. 13, No. 7, Jul. 2003, pp. 620-636.

International Search Report for PCT/JP2008/058166 mailed Aug. 5, 2008.

K. Chono et al., "A PCM Coding Method using Decoded Images for obeying the upper limit on the number of bits of MB in H.264 encoding", PCSJ (Picture Coding Symposium of Japan), Session P5-17, Nov. 2006.

H. Okamoto et al., "Switched Entropy Coding Method for Real-Time High Defination Applications of H.264/AVC", The Institute of Electronics, Information and Communication Engineers General Conference, D-11-2, Mar. 2007.

Taiwanese Office Action for No. 097118559 issued on Jul. 24, 2012.

* cited by examiner

IMAGE ENCODING APPARATUS, IMAGE ENCODING METHOD, AND IMAGE ENCODING PROGRAM

This application is the National Phase of PCT/JP2008/058166, filed Apr. 28, 2008, which is based upon and claims priority from Japanese Patent Application No. 2007-134162 filed May 21, 2007.

BACKGROUND OF THE INVENTION

1. Technical Field

The present invention relates to an image encoding apparatus, an image encoding method, and an image encoding program using image encoding technology. In particular, the present invention relates to an image encoding apparatus, an image encoding method, and an image encoding program capable of selecting an entropy encoding scheme.

2. Background Art

An image encoding apparatus encodes external input image data in accordance with a predetermined image encoding scheme to generate a bit stream. H.264/AVC is known as one of image encoding schemes used for such encoding process (see Non-patent document 1). This scheme conforms to MPEG (Moving Picture Experts Group)-4 Written Standards Part 10, and Joint model scheme is known as its encoding reference model. An image encoding apparatus based on the Joint model scheme, which is related to the present invention, is called "related art image encoding apparatus" hereinafter.

FIG. 9 shows a structure of a related art image encoding apparatus. The related art image encoding apparatus 100 includes an image frame buffer 102 to successively store image frames which constitute a target image data 101 to be compressed. An image data 103 is divided into and outputted as macro blocks having a predetermined image area size from the image frame buffer 102, and inputted to a macro block encoder 104 in which the image data is encoded in units of macro blocks. A code amount controller 105 and a decoded picture buffer 106 are connected to the macro block encoder 104. The macro block encoder 104 outputs an encoded bit stream 107. The definitions of the macro block and picture is explained later.

The macro block encoder 104 of such image encoding apparatus 100 includes a macro block buffer 111 to receive the image data 103, a predicting device 112 connected to the macro block buffer 111, a calculating device 113 to subtract the output from the predicting device 112 from the output of the macro block buffer 111, a conversion and quantization device 114 to convert and quantize the calculation result from the calculating device 113 under the control of the code amount controller 105, an entropy encoder 115 and inverse-conversion and inverse-quantization device 116 arranged on the output side of the conversion and quantization device 114, and an adder 117 arranged on the output side of the inverse-conversion and inverse-quantization device 116.

Assume that the image data 101 inputted to the image encoding apparatus 100 has a QCIF (Quarter Common Intermediate Format). The QCIF is one of image signal formats defined in the ITU (International Telecommunication Union).

FIG. 10 shows an image frame in the QCIF image format. The image flame in the QCIF is composed of macro blocks of 176 blocks in wide by 144 blocks in high. One image frame is composed of one frame picture in the progressive scanning. Furthermore, one image frame is composed of two field pictures in the interlace scanning. They are called simply "picture(s)" in the following explanation.

Each macro block, which is the unit constituting the picture, is composed of brightness pixels in 16×16 pixels, and color-difference pixels of Cr (color-difference signals) and Cb (color-difference signals), each in 8×8 pixels. FIG. 10 shows a brightness position (x) and color-difference position (o) of an 8×8 pixel block on a pixel-by-pixel basis when the macro block is divided into 16 parts.

The macro block encoder 104 shown in FIG. 9 encodes the image data 103 in units of macro blocks. In this case, the encoding is successively performed with raster scanning diagonally from the upper left of the picture to the lower right in similar manner to the raster scan for a television system.

Firstly, the macro block buffer 111 of the macro block encoder 104 reads a target image data to be encoded in macro blocks, temporally stores it, and supplies it to the conversion and quantization device 114 arranged at the subsequent stage. At this point, the calculating device 113 subtracts a prediction image 122 outputted from the predicting device 112 from the image 121 read from the macro block buffer 111 in macro blocks, and the supplies the prediction error image 123 (i.e., the calculation result) to the conversion and quantization device 114.

Incidentally, there are two types of the prediction error image 123, i.e., a prediction image generated based on inter-frame prediction and a prediction image generated based on intra-frame prediction. The inter-frame prediction is generated using the correlation between separate image frames, i.e., using the image of an image frame which was encoded and reconstructed before and which has a different display time from the current target image frame to be encoded. On the other hand, the intra-frame prediction is generated using the correlation within the image frame, i.e., using the image of an image frame which was encoded and reconstructed before the current target image frame to be encoded and has the same display time as the current target image frame.

A set (slice) of macro blocks which can be encoded using the intra-frame prediction alone is called "I-slice" hereinafter. Furthermore, a slice of macro blocks which can be encoded using both the intra-frame prediction and inter-frame prediction is called "P-slice". Furthermore, a slice of macro blocks which can be encoded using the inter-frame prediction where not only the image of one image frame but also the images of two image frames can be used simultaneously is called "B-slice".

Furthermore, a picture which can be encoded using the I-slice is called "I-picture", and a picture which can be encoded using both the I-slice and P-slice is called "P-picture". Furthermore, a picture which can be encoded using not only the I-slice and P-slice but also the B-slice is called "B-picture".

The conversion and quantization device 114 frequency-converts the prediction error image 123 in smaller units than macro blocks. It converts the prediction error image 123 from a spatial domain to a frequency domain. In the AVC (Advanced Video Coding) Standards, a frequency conversion in units of 8×8 blocks or 4×4 blocks is applicable to brightness pixels. A prediction error image converted to a frequency domain is called "conversion coefficient" hereinafter. This conversion coefficient is quantized based on a parameter 125 supplied from the code amount controller 105, and supplied to the entropy encoder 115 as code data 126. This quantized conversion coefficient is called "quantized value" in the specification.

The code data 126 is also supplied to the inverse-conversion and inverse-quantization device 116. The inverse-conversion and inverse-quantization device 116 inverse-quantizes the quantized value supplied from the conversion and quantization device 114, and further inverse-frequency-converts it to the original spatial domain. Then, the adder 117 adds the prediction image 122 supplied from the predicting device 112 to the prediction error image which was restored to the spatial domain to obtain a decoded image 128. This decoded image 128 is stored in the decoded picture buffer 106 for subsequent encoding.

The entropy encoder 115 entropy-encodes the inputted code data 126 and outputs a bit stream 107. The term "entropy-encoding" means compression of data in which a code having different length is assigned depending on the occurring probability of the data. Since the present invention closely relates to the entropy encoder 115, the detail of it will be explained later.

The predicting device 112 supplies a generating parameter of a prediction image to the entropy encoder 115 as code data 129. The generating parameter may includes, for example, a prediction mode indicating the type of prediction such as inter-frame prediction and intra-frame prediction, a index of a decoded frame used in inter-frame prediction, a motion vector used in inter-frame prediction, and intra-frame prediction direction used in intra-frame prediction.

As explained above, the decoded picture buffer 106 stores the decoded image 128 supplied from the inverse-conversion and inverse-quantization device 116. Then, it manages decoded image pictures reconstructed from the decoded image 128 (which is simply called "decoded pictures" hereinafter).

The code amount controller 105 monitors a bit stream 131 outputted from the entropy encoder 115 to encode a picture with a desired bit number. Then, if the bit number of the bit stream 131 is larger than the desired bit number, it outputs a parameter indicating the increase of a quantizing step size as a quantizing parameter 125. On the other hand, if the bit number of the bit stream 131 is smaller than the desired bit number, it outputs a parameter indicating the decrease of a quantizing step size as the quantizing parameter 125.

The entropy encoder 115 also monitors a symbol number (bin number) which is inputted to an arithmetic encoder (which is explained later) in the case where CABAC (Context-based Adaptive Binary Arithmetic Coding) is used as entropy encoding with a entropy encoding selecting signal 132 (the detail of the CABAC is explained later). Then, the quantizing parameter will be adjusted such that the ratio between a bit number and a bin number satisfies the ratio specified in the above-mentioned AVC Standards.

FIG. 11 shows the specific structure of this entropy encoder. The entropy encoder 115 includes a first selector 141 to receive the image code data 126 outputted from the conversion and quantization device 114 shown in FIG. 9, a CABAC device 142 having an input side connected to one of the output sides of the first selector 141, a VLC (Variable Length Coding) device 143 having an input side connected to the other output side of the first selector 141, and a second selector 144 to selectively receive one of the outputs from the CABAC device 142 and VLC device 143 which are used as the devices for these two types of coding.

An entropy encoding mode selecting signal 132 is provided to the entropy encoder 115 for the switching of the first selector 141 and second selector 144. The entropy encoding mode selecting signal 132 is a signal to select one of the CABAC device 142 and VLC device 143. In this manner, in the AVC (Advanced Video Coding) Standards, entropy encoding is performed on the code data 126 of macro blocks on a picture-by-picture basis by selecting one of the coding by CABAC device 142 or the coding by VLC device 143.

In the entropy encoder 115 shown in FIG. 11, the CABAC device 142 receives a code data $126_1$ outputted from the first selector 141, and outputs a bit stream $107_1$ to the second selector 144. The CABAC device 142 also outputs a bin number data 145 representing a bin number. The specific structure of the CABAC device 142 is explained later.

The VLC device 143 receives a code data $126_2$ outputted from the first selector 141, and outputs a bit stream $107_2$ to the second selector 144. The specific structure of the VLC device 143 is explained later. The second selector 144 also outputs a bit number data 146 representing a bit number as well as the bit stream 107.

Incidentally, the CABAC device 142 achieves higher encoding efficiency than the VLC device 143. However, the CABAC device 142 requires larger processing effort than the VLC device 143. Therefore, in general, the CABAC device 142 is used for a higher profile (e.g., High profile or Main profile) which supports complicated process. Meanwhile, the VLC device 143 is used for a lower profile (e.g., Base-line profile) which does not support complicated process. However, since code data in higher level layers than a macro block layer has a relatively smaller code data amount which occupies a bit stream, the VLC device 143 is used for code data in such layers to prioritize comparability among each profile.

FIG. 12 shows the specific structure of a CABAC device. The CABAC device 142 includes a binarization device 151 to receive a code data $126_1$ through the first selector 141 shown in FIG. 11 and converting it to binary, and a switch 153 to switch the output of the binary outputted from the binarization device 151. A bin 155 outputted from the switch 153 as a binary symbol is supplied to an arithmetic encoder 156 and a context calculator 157.

The binarization device 151 is adapted to convert inputted code data $126_1$ to a binary string in accordance with procedure specified in the AVC Standards and output it as a binary string data 152. The arithmetic encoder 156 encodes the binary string of the bin 155 which is successively supplied from the switch 153 to binary arithmetic code by using a dominant symbol 158 and a state number 159 supplied from the context calculator 157. Furthermore, it successively supplies an updated dominant symbol 158 and an updated state number 159 to the context calculator 157. The term "state number 159" means a table number of a table storing a value corresponding to the occurring probability of dominant symbol specified in the AVC Standards.

The context calculator 157 supplies stored dominant symbol 158 and state number 159 corresponding to the bin 155 which is successively supplied from the switch 153 as a symbol. Furthermore, it also stores the dominant symbol 158 and state number 159 which are updated by the binary arithmetic encoding at the arithmetic encoder 156.

The switch 153 outputs a bin number data 145 to the outside of the CABAC device 142. Furthermore, the arithmetic encoder 156 outputs a bit stream $107_1$ to the outside of the CABAC device 142. As shown in FIG. 11, the bit stream $107_1$ is supplied to the second selector 144 in parallel to a bit stream $107_2$ outputted from the VLC device 143.

FIG. 13 shows the specific structure of a VLC device. The VLC device 143 includes a variable length encoder 161 to receive a code data $126_2$ through the first selector 141 shown in FIG. 11, and a table selector 162.

The variable length encoder 161 encodes the code data $126_2$ to variable length code in accordance with a table specified by the table selector 162, and outputs a bit stream $107_2$. The table selector 162 contains variable length encoding tables (not shown) corresponding to the types of code data $126_2$ such as a prediction mode, a quantized value, and the like. Then, it supplies a table 163 selected from variable length encoding tables to the variable length encoder 161.

In accordance with the image encoding apparatus 100 described above which is related to the present invention, when the VLC device 143 (FIG. 11) is used for entropy encoding, the completion time of the picture encoding by this image encoding apparatus 100 is determined by the amount of inputted code data.

On the other hand, when the CABAC device 142 shown in FIG. 12 is used as the block for entropy encoding, the completion time of the picture encoding by this image encoding apparatus 100 is determined by the number of the bin 155 inputted to the arithmetic encoder 156. Incidentally, in the case where a block other than the CABAC device 142 is used, the process will be always completed within finite length of time since the amount of input data is finite.

In the H.264/AVC Standards, the following two items are used as restrictions to limit the processing amount of entropy encoding per picture on the decoding side. (a) Encoding must be controlled such that the bit number of a picture becomes equal to or less than a value specified in the H.264/AVC Standards. (b) Encoding must be controlled such that the ratio between the bit number and bin number of a picture becomes equal to or less than a value specified in the H.264/AVC Standards.

Since the VLC device 143 shown in FIG. 13 allows process in units of the code data $126_2$, its process is simpler than that of the CABAC device 142 shown in FIG. 12. Therefore, assuming that the process is always completed within a certain time period, encoding of the image encoding apparatus 100 needs to be controlled such that the bin number of a picture does not exceeds the maximum bin number for which the arithmetic encoder 156 can process during the processing time.

A following method is one of exemplary methods for such encoding controlling. (i) For a picture having a large bin number, there is a method of encoding using PCM (Pulse-Code Modulation) mode in which a input image in macro blocks is directly outputted as a bit stream (Patent document 1 and Non-patent document 2). (ii) There is another method in which CABAC device 142 and a VLC device 143 are operated in parallel for the code data of a picture. Then, if the process of the CABAC device 142 is completed within a predetermined time, the encoding output from this CABAC device 142 is selected for the encoding. If not, the encoding output from this VLC device 143 is selected for the encoding (Non-patent document 3).

[Patent document 1] Japanese unexamined application publication No. 2004-135251 (paragraphs 121-124, and FIG. 1).
[Non-patent document 1] ISO/IEC 14496-10 Advanced Video Coding.
[Non-patent document 2] "PCM ENCODING METHOD CONFORMING TO H.264 MB UPPER LIMIT BIT USING LOCAL DECODE IMAGE" by Chono et al, PCSJ (Picture Coding Symposium of Japan), pp. 5-17, November 2006.
[Non-patent document 3] "ENTROPY ENCODING TECHNIQUE IN H.264/AVC FOR HIGH-RESOLUTION" by Okamoto et al, The Institute of Electronics, Information and Communication Engineers General Conference, D-11-2, March 2007.

SUMMARY

The former method using a PCM mode is effective for applications in which the bin number of one macro block is restricted. However, there is a problem associated with degraded images in such applications in which the bin number of a picture is restricted (i.e., the number of bins of a plurality of macro blocks is restricted). Because when the PCM mode is heavily used in a picture to implement the method stated in the above item (i), a macro block which is encoded after the heavy use of the PCM mode is coarsely quantized since the PCM mode has a large output bit number.

Meanwhile, in the latter method in which a CABAC device 142 and a VLC device 143 are operated in parallel, and one of the encoding outputs is selected, it becomes after-the-event selection. Therefore, it poses a critical problem in the image encoding apparatus 100 that the encoding cannot be controlled in units smaller than the picture. Because the bit number for the code data 126 inputted to the entropy encoder 115 is unknown until the selected encoding output becomes known.

Incidentally, Patent document 1 proposes a method in which when the bin number of code data encoded from an image is larger than a predetermined value, an alternative bit stream of code data separately encoded from the above-mentioned image with a different encoding parameter (e.g., different quantizing parameter) (such that its bin number becomes smaller than the predetermined value) is outputted. However, since this method is also the after-the-event selection, it has a critical problem similar to the above-mentioned problem.

The present invention has been made in view of these circumstances, and provides an image encoding apparatus, an image encoding method, and an image encoding program capable of minimizing image degradation, controlling a code amount in units smaller than pictures, and ensuring that encoding of the picture is completed within a certain time period.

In accordance with one aspect of the present invention, an image encoding apparatus includes: (a) a code data generator to transform and quantize an image block to generate code data; (b) a variable length code encoder to encode the code data into bit-string data on the basis of applying variable length encoding; (c) an arithmetic encoder to encode the code data into bit-string data on the basis of converting the code data into binary symbols and applying binary arithmetic encoding; (d) a binary symbol number estimator to estimate the total number of the binary symbols that are converted from the code data generated from a plurality of image blocks; and (e) a encoding selector to select, for the encoding of the code data, either the variable length code encoder or the arithmetic encoder for the encoding of the code data on the basis of the total number estimated by the binary symbol number estimator.

That is, the present invention in one aspect achieves the above-mentioned object by estimating the bin number of the image of a target picture to be encoded; and controlling entropy encoding and the target bit number (assigned picture rate) of the picture using the estimated bin number and compression ratios of the variable length encoder and arithmetic encoder.

In accordance with another aspect of the present invention, an image encoding method includes: (a) transforming and quantizing an image block to generate code data; (b) estimating the total number of the binary symbols that are converted from the code data generated from a plurality of image blocks; and (c) selecting the encoding method of the code data from variable length encoding and arithmetic encoding on the basis of the total number estimated, the variable length encoding being adapted to encode the code data into bit-string data on the basis of applying variable length encoding, and the arithmetic encoding being adapted to encode the code data into bit-string data on the basis of converting the code data into binary symbols and applying binary arithmetic encoding.

That is, the present invention in one aspect expresses similar technical idea to the above-mentioned image encoding apparatus as the transitions of processes.

In accordance with another aspect, the present invention provides a computer-readable recording medium recording an image encoding program to instruct a computer to execute: (a) a code data generating process to transform and quantize an image block to generate code data; (b) a binary symbol number estimating process to estimate the total number of the binary symbols that are converted from the code data generated from a plurality of image blocks; and (c) an encoding selecting process to select the encoding method of the code data from variable length encoding and arithmetic encoding on the basis of the total number estimated by the binary symbol number estimating process, the variable length encoding being adapted to encode the code data into bit-string data on the basis of applying variable length encoding, and the arithmetic encoding being adapted to encode the code data into bit-string data on the basis of converting the code data into binary symbols and applying binary arithmetic encoding.

That is, the present invention in one aspect expresses similar technical idea to the above-mentioned image encoding apparatus as a program executed by a computer.

The above and other objects, features and advantages of the present invention will become more fully understood from the detailed description given hereinbelow and the accompanying drawings which are given by way of illustration only, and thus are not to be considered as limiting the present invention.

Figure 1:
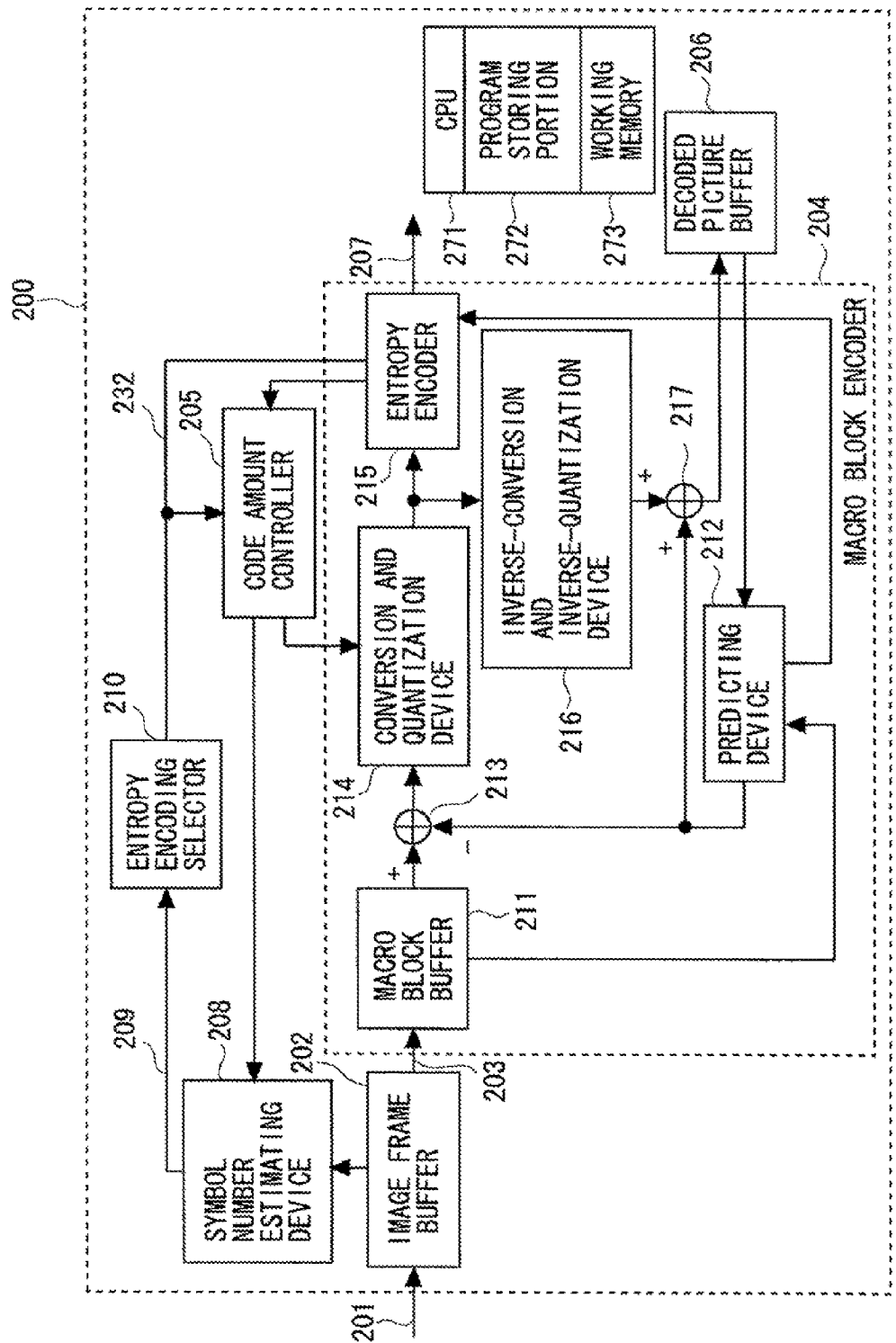
FIG. 1 is a block diagram showing the structure of an image encoding apparatus in accordance with a first embodiment of the present invention.

| DESCRIPTION OF THE REFERENCE NUMERALS | |
|---|---|
| 142(242) | CABCA DEVICE |
| 143(243) | VLC DEVICE |
| 200, 400, 600 | IMAGE ENCODING APPARATUS |
| 202 | MACRO BLOCK BUFFER |
| 204 | MACRO BLOCK ENCODER |
| 205, 422 | CODE AMOUNT CONTROLLER |
| 208, 424, 608 | SYMBOL NUMBER ESTIMATING DEVICE |
| 209 | BIN NUMBER |
| 210, 425, 609 | ENTROPY ENCODING SELECTOR |
| 212 | PREDICTING DEVICE |
| 214 | CONVERSION AND QUANTIZATION DEVICE |
| 215 | ENTROPY ENCODER |
| 232 | ENTROPY ENCODING MODE SELECTING SIGNAL |
| 271, 431, 671 | CPU |
| 272, 432, 672 | PROGRAM STORING PORTION |
| 404 | PRELIMINARY ENCODER |
| 405 | MAIN ENCODER |
| 604 | PRELIMINARY PARALLEL ENCODER |
| 605 | MAIN PARALLEL ENCODER |
| 611 | PRELIMINARY MACRO BLOCK ENCODER |
| 621 | MAIN MACRO BLOCK ENCODER |

EXEMPLARY EMBODIMENT

Exemplary embodiments in accordance with the present invention are explained hereinafter.

First Embodiment

FIG. 1 shows the structure of an image encoding apparatus in accordance with a first embodiment of the present invention. An image encoding apparatus 200 in accordance with a first embodiment includes an image frame buffer 202 to successively store target image data 201 to be compressed. The image frame buffer 202 outputs image data 203 in units of macro blocks in similar manner to the above-explained image encoding apparatus 100 (FIG. 9) in the related art to the present invention. This image data 203 is inputted to a macro block encoder 204, and encoded in units of macro blocks. A code amount controller 205 and a decoded picture buffer 206 are connected to the macro block encoder 204.

A symbol number estimating device 208 which estimates the bin number of macro blocks of a target picture to be encoded, i.e., the total bin number of a plurality of macro blocks constituting the picture, is connected to the image frame buffer 202. The symbol number estimating device 208 reads the image of a target picture to be encoded which is stored in the image frame buffer 202, and an assigned picture rate for the target picture to be encoded at the 205, and performs the above-mentioned estimation.

The bin number of the macro blocks of the target picture to be encoded which was estimated by the symbol number estimating device 208 is inputted to an entropy encoding selector 210. The entropy encoding selector 210 outputs an entropy encoding mode selecting signal 232, which is used to select a entropy encoding mode, based on the inputted bin number 209.

Figure 9:
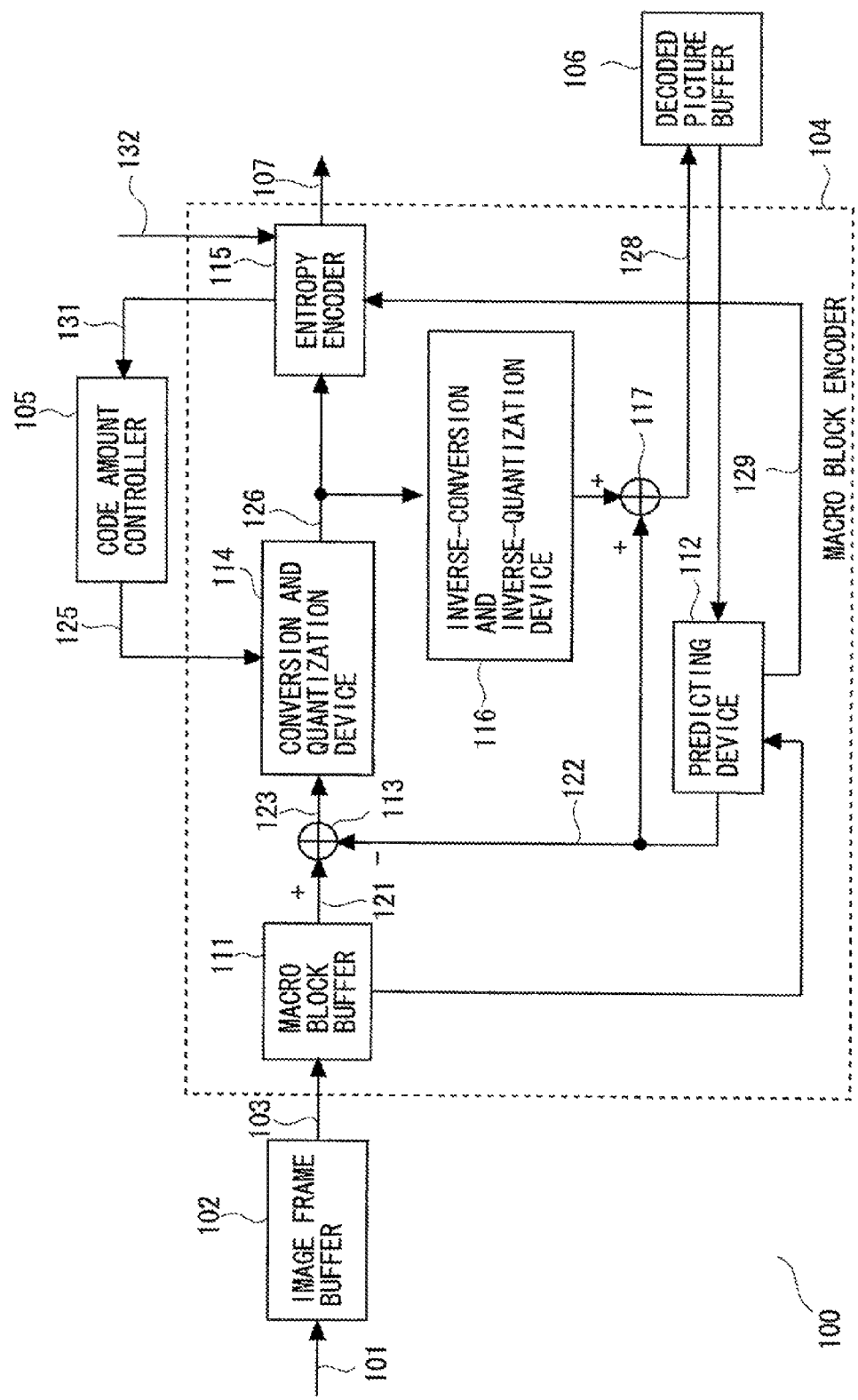
FIG. 9 is a block diagram showing the structure of an image encoding apparatus of related art.
Figure 10:
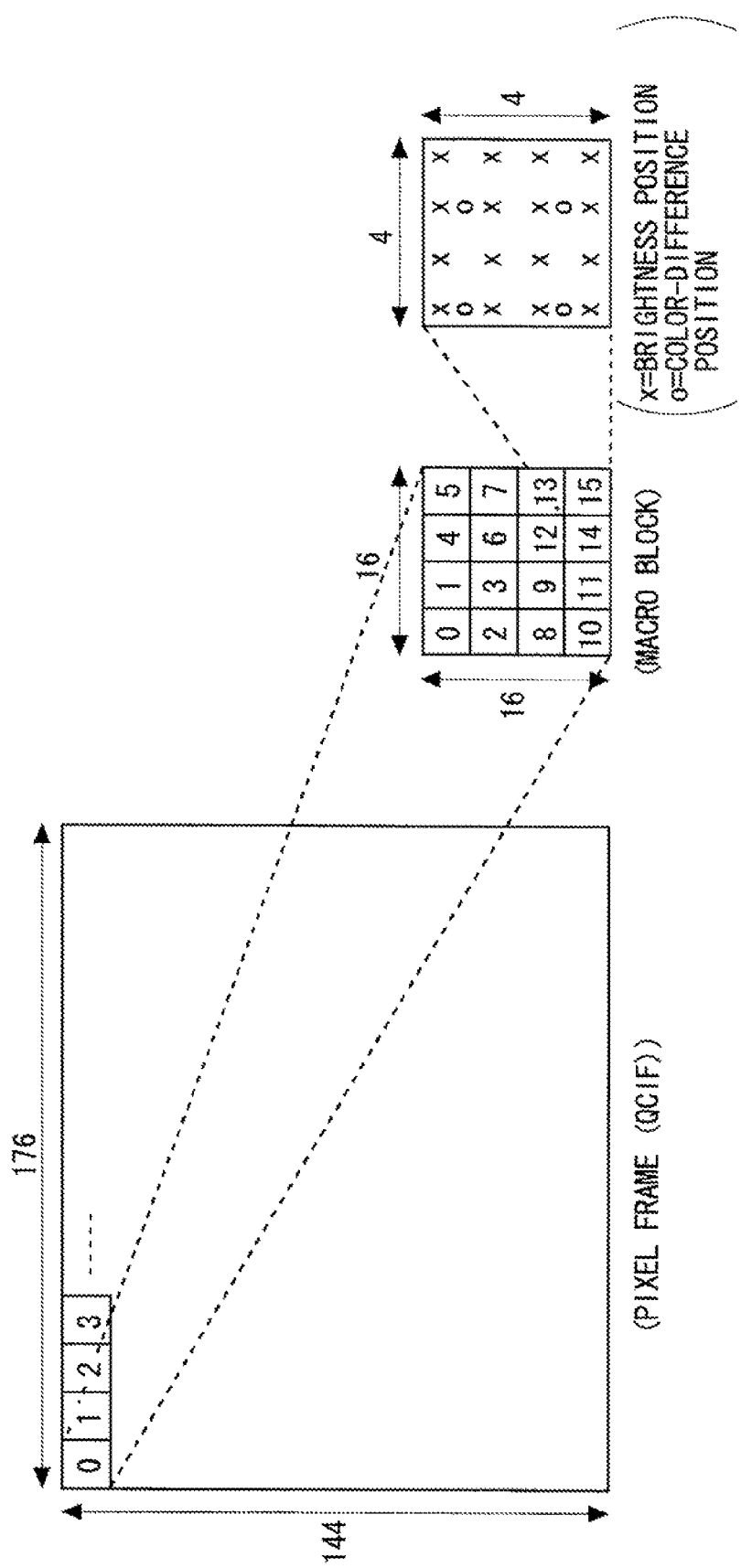
FIG. 10 is an explanatory diagram showing an image frame in the QCIF image format.

The macro block encoder 204 includes, in comparison to the macro block encoder 104 shown in FIG. 9, a macro block buffer 211 to receive the image data 203, a predicting device 212 connected to the macro block buffer 211, a calculating device 213 to subtract the output from the predicting device 212 from the output of the macro block buffer 211, a conversion and quantization device 214 to convert and quantize the calculation result from the calculating device 213 under the control of the code amount controller 205, an entropy encoder 215 and inverse-quantization and inverse-conversion device 216 arranged on the output side of the conversion and quantization device 214, and an adder 217 arranged on the output side of the inverse-conversion and inverse-quantization device 216. The macro block encoder 204 outputs an encoded bit stream 207.

The image encoding apparatus 200 in accordance with this embodiment includes a CPU (Central Processing Unit) 271, a program storing portion 272 such as a disk drive and an optical disk to store a control program executed by this CPU 271, and a working memory 273 such as semiconductor memory to temporally store various data during the time when the CPU 271 is executing the control program stored in the program storing portion 272. At least some part of the components shown in FIG. 1 may be achieved by software operations by the CPU 271 executing the control program stored in the program storing portion 272.

In the image encoding apparatus 200 having structure explained above, the code amount controller 205 specifies an assigned picture rate depending on the indicated content of the entropy encoding mode selecting signal 232 established by the entropy encoding selector 210. Therefore, its operations are different from the code amount controller 105 shown in FIG. 9. That is, the code amount controller 105 shown in FIG. 9 is set up in accordance with an instruction manual, and in general, one of the CABAC device 242 or VLC device 243 which corresponds to the CABAC device 142 and VLC device 143 respectively in FIG. 11 and is selected in a fixed manner in accordance with a profile.

Figure 11:
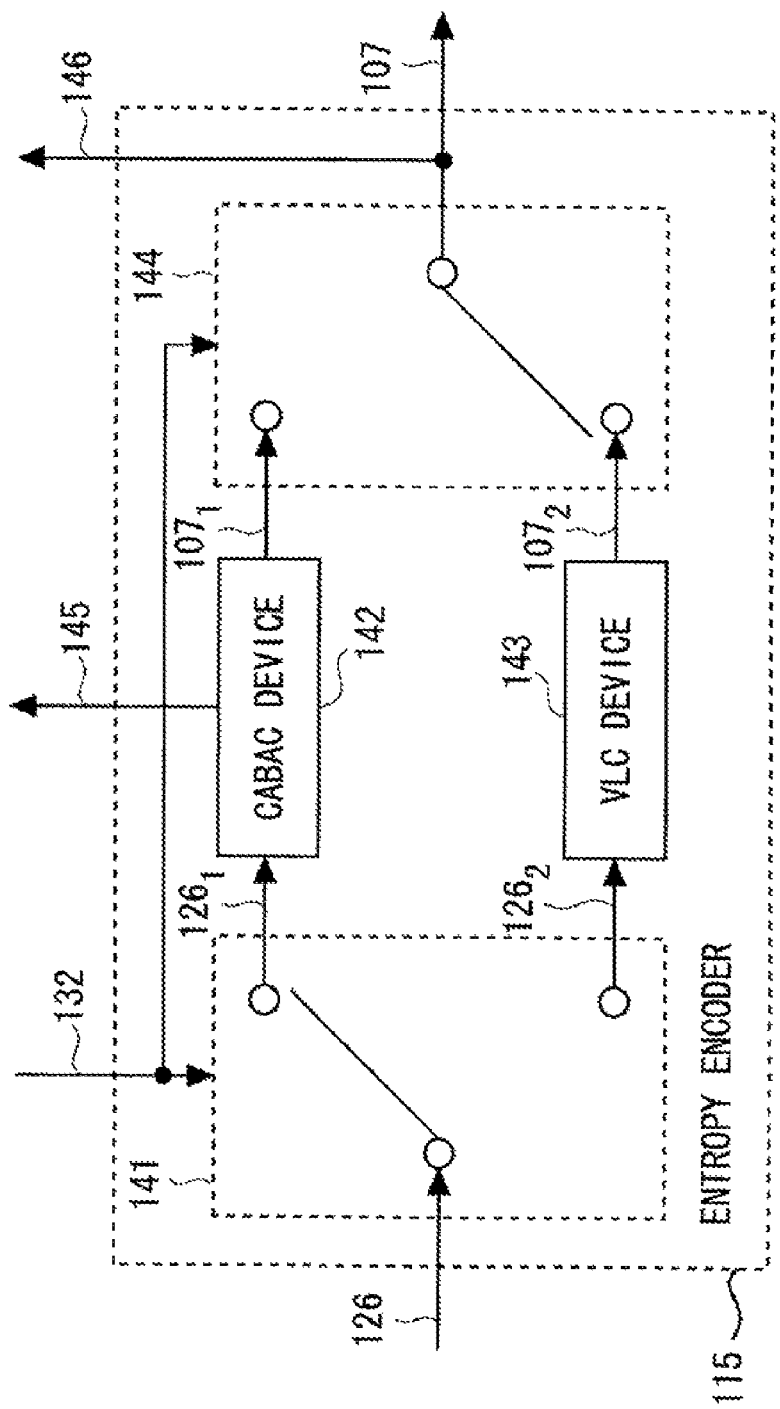
FIG. 11 is a block diagram showing the specific structure of an entropy encoder.
Figure 12:
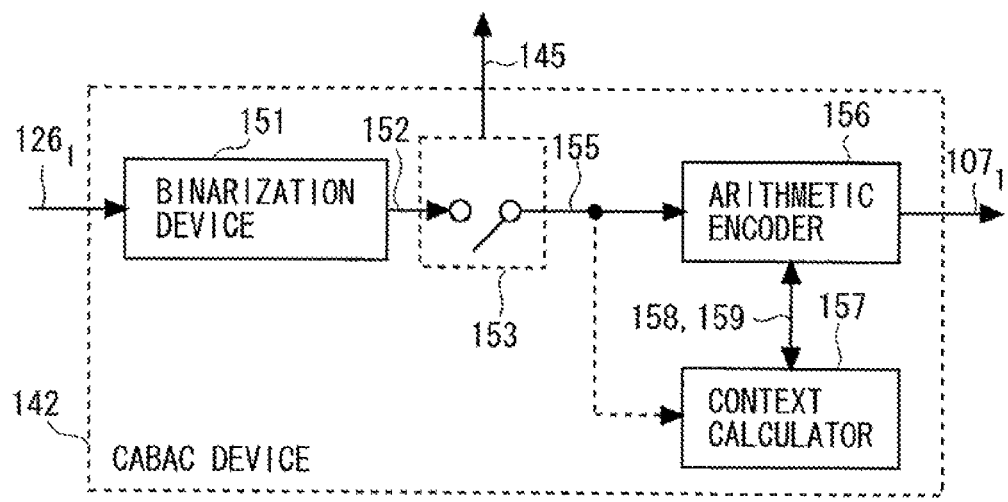
FIG. 12 is a block diagram showing the specific structure of a CABAC device shown in FIG. 11.
Figure 13:
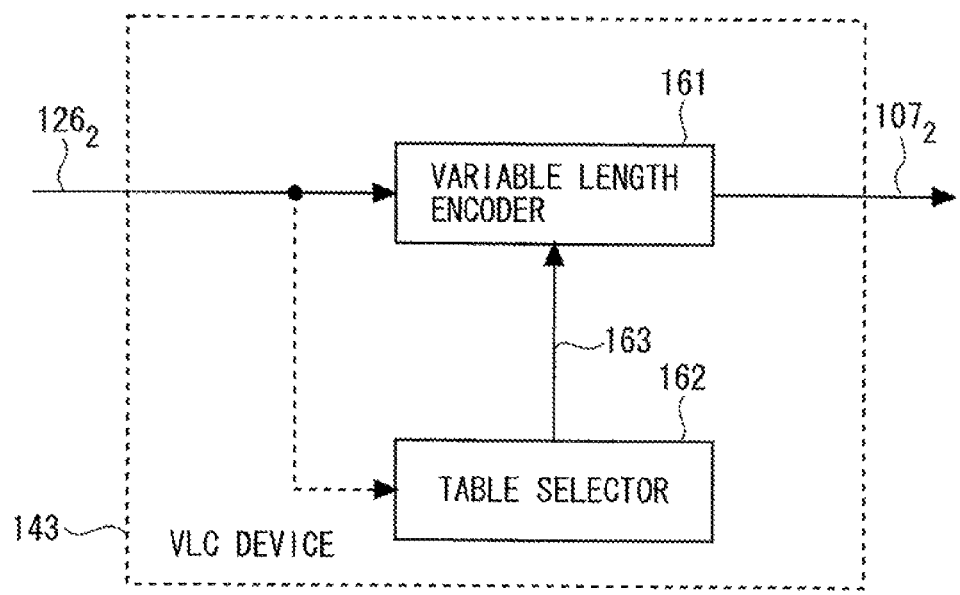
FIG. 13 is a block diagram showing the specific structure of a VLC device shown in FIG. 11.

The macro block encoder 204 in accordance with the first embodiment of the present invention has substantially the same components such as the macro block buffer 211 and entropy encoder 215 as those of the macro block encoder 104. Therefore, the structures shown in FIGS. 11-13 are applied to this embodiment without any modification. However, in this embodiment, the number in hundreds place of the sign representing each component is changed from "1" to "2" in the following explanation.

Incidentally, the image encoding apparatus 200 of this embodiment determines the content of the entropy encoding mode selecting signal 232 by operating the symbol number estimating device 208 and entropy encoding selector 210 at the start of the picture encoding. The image encoding apparatus 200 of this embodiment updates the assigned picture rate by operating the code amount controller 205 after the decision of the content of the entropy encoding mode selecting signal 232 and before the start of the encoding of macro blocks within a target picture to be encoded. After the picture rate update, the image encoding apparatus 200 successively encodes macro blocks within the target picture to be encoded by operating the macro block encoder 204. Then, after the whole macro blocks within the picture are encoded, the image encoding apparatus 200 performs predetermined processes and starts the encoding of the next picture.

Figure 2:
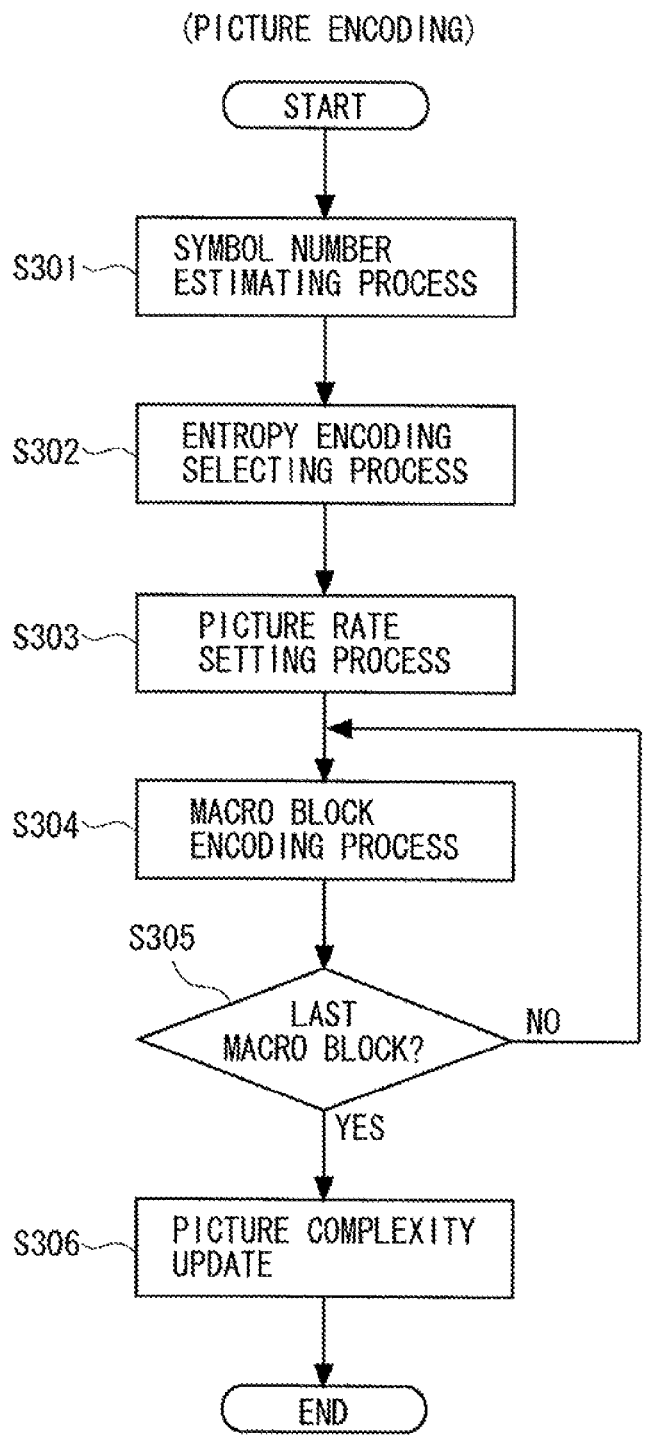
FIG. 2 is a flowchart showing the operation of the image encoding apparatus in accordance with the first embodiment from the start of picture encoding to the end thereof.

FIG. 2 shows the operation of the image encoding apparatus in accordance with this embodiment from the start to the end of picture encoding. The following explanation is made with reference to FIG. 1 and FIGS. 9-13.

Firstly, the image encoding apparatus 200 of this embodiment starts the picture encoding with symbol number estimating process using the symbol number estimating device 208 (Step S301). Assume that the brightness pixel data of the target picture to be encoded which is stored at the image frame buffer 202 is src[y][x] (wherein $0 \leq x \leq$ width$-1$, $0 \leq y \leq$ height$-1$) at the start of the picture encoding when an image data 201 is sent from a image data source (not shown).

In the formulas, "x" is a horizontal position of a pixel within the picture, and "y" is a vertical position of the pixel. Furthermore, "width" is the horizontal pixel count of the picture, and "height" is the vertical pixel count.

In the symbol number estimating process of the step S301, the symbol number estimating device 208 estimates the bin number from the brightness pixel data src[y][x]. To this end, an activity mb_act[i] is calculated for each macro block with the following equation (1) using this brightness pixel data src[y][x].

$$\text{mb\_act}[i] = \sum_{x=mbx(i)}^{mbx(i)+15} \sum_{y=mby(i)}^{mby(i)+15} |src[y][x] - ave[i]| \quad (1)$$

In the equation (1), "ave[i] is expressed by the following equation (2). As seen from the equation (1), the activities represent variations of the pixel values of macro blocks. Therefore, it is possible to use the standard deviation or variance of the pixel values of the macro blocks.

$$ave[i] = \frac{1}{256} \times \sum_{x=mbx(i)}^{mbx(i)+15} \sum_{y=mby(i)}^{mby(i)+15} |src[y][x]| \quad (2)$$

In the equations (1) and (2), "i" is a macro block address in order of raster scanning within a picture. Furthermore, "mbx(i)" is a horizontal position of a macro block within the picture corresponding to the macro block address i, and "mby(i)" is a vertical position of the macro block within the picture corresponding to the macro block address i.

Then, in the symbol number estimating process of the step S301, estimated bin number complexity of the target picture to be encoded epic_bin_x is calculated with the following equation (3) using the activity for each macro block mb_act[i].

$$\text{epic\_bin\_}x = \alpha \times \text{pic\_act} + \beta \quad (3)$$

In the equation, "pic_act" is expressed by the following equation (4).

$$\text{pic\_act} = \sum_{i=0}^{pic\_size\_mbs-1} \text{mb\_act}[i] \quad (4)$$

In the equations (3) and (4), "α" and β represent the gradient and intercept respectively of the regression line of I picture bin number complexity for the activity. Furthermore, "pic_size_mbs" is the number of macro blocks contained in the picture (c=(width*height)/256). The term "I picture bin number complexity pic_bin_x" means the product of the picture bin number pic_bin and the average quantizing step size of the macro block pic_qs (i.e., pic_bin_x=pic_bin*pic_qs) when the target picture to be encoded is encoded as I picture.

At the end of the symbol number estimating process of the step S301, estimated bin number of the target picture to be encoded epic_bin is calculated with the following equation (5) using the estimated bin number complexity of the target picture to be encoded epic_bin_x and the assigned picture rate for the target picture to be encoded pic_rate.

$$epic\_bin = \max(epic\_bin\_x/qs\_rc, \gamma \times pic\_rate) \quad (5)$$

In the equation, "qs_rc" is expressed by the following equation (6).

$$qs\_rc = pic\_x/pic\_rate \quad (6)$$

In the equations (5) and (6), the picture complexity pic_x is the product of the occurring picture rate of the picture which has the same picture type as the target picture to be encoded (which is explained later) and is encoded lastly i.e., last_pic_rate and the average quantizing step size of the macro block last_pic_qs. Furthermore, "γ" is the ratio between the symbol number bin and the bit number bit (γ=bin/bit), In the equation, "γ" is larger number than 1. The "γ" may be a statistical ratio for each picture type, or a ratio calculated from the data on a lastly encoded picture for each picture type.

After the symbol number estimating process of the step S301 is completed in this manner, an entropy encoding selecting process is performed (Step S302). At the step S302, the entropy encoding selector 210 selects the entropy encoding mode selecting signal 232 using the estimated bin number of the target picture to be encoded epic_bin. Then, it calculates the average quantizing step size qs_cabac using the following equation (7) for the case where the target picture is encoded by the CABAC device 242 (see FIG. 12)

$$qs\_cabac = \gamma \times pic\_x/\min(epic\_bin, ppic\_bin) \quad (7)$$

In the equation, "ppic_bin" is expressed by the following equation (8).

$$ppic\_bin = pmb\_bin \times pic\_size\_mbs \quad (8)$$

In the equations (7) and (8), "pmb_bin" is the bin number for which the arithmetic encoder of the CABAC device 242 (see FIG. 12) of the entropy encoder 215 can process within the encoding time of 1 macro block. Therefore, the average quantizing step size qs_cabac is the image quality by the CABAC device 242 under the condition where the upper limit bit number is imposed by the processible bin number within a predetermined time period. The smaller the average quantizing step size qs_cabac, the better the image quality becomes.

Then, in the entropy encoding selecting process of the step S302, it calculates the average quantizing step size qs_vlc using the following equation (9) for the case where the target picture is encoded by the VLC device 243.

$$qs\_vlc = \gamma \times pic\_x/pic\_rate \quad (9)$$

In the equation (9), "γ" is the compression ratio between the bit number when the code data of a picture is processed by the VLC device 243 vlc_bit and the bit number when it is arithmetically encoded cabac_bit (γ=vlc_bit/cabac_bit). Furthermore, "γ" is larger number than 1, and a statistical ratio for each picture type. As seen from the definition of "γ", the average quantizing step size qs_vlc is the image quality by the VLC device 243 under the condition where the reduction in compression efficiency by the VLC device 243 is imposed.

At the end of the entropy encoding selecting process of the step S302, the entropy encoding mode selecting signal 232 is determined by the following equation (10) using the average quantizing step size qs_cabac and the average quantizing step size qs_vlc.

$$mode = \begin{cases} CABAC & \text{... if } (qs\_cabac \leq qs\_vlc) \\ VLC & \text{... Otherwise.} \end{cases} \quad (10)$$

After the entropy encoding selecting process of the step S302 is completed in this manner, a picture rate setting process is performed (Step S303). In this picture rate setting process, the code amount controller 205 updates the assigned picture rate of the target picture to be encoded pic_rate based on the entropy encoding mode selecting signal 232 (mode) using the following equation (11).

$$pic\_rate = \begin{cases} pic\_x/qs\_vlc & \text{... if } (mode = VLC) \\ pic\_x/qs\_cabac & \text{... Otherwise.} \end{cases} \quad (11)$$

Incidentally, the quantizing step size qs_rc to achieve the assigned picture rate pic_rate can be calculated with the following equation (12).

$$qs\_rc = \begin{cases} qs\_vlc & \text{... if } (mode = VLC) \\ qs\_cabac & \text{... Otherwise.} \end{cases} \quad (12)$$

After the picture rate setting process of the step S303 is completed in this manner, a macro block encoding process is performed (Step S304). In this macro block encoding process, the macro block encoder 204 encodes one macro block of the target picture to be encoded using the decided entropy encoding mode selecting signal 232.

At this point, similar to the code amount controller 105 of the image encoding apparatus 100 shown in FIG. 9, the code amount controller 205 monitors a bit stream 207 outputted from the entropy encoder 215. Then, if the bit number of the bit stream 207 outputted from the entropy encoder 215 is larger than the assigned picture rate, it outputs a quantizing parameter indicating the increase of a quantizing step size. On the other hand, if the bit number of the bit stream 207 is smaller than the assigned picture rate, the code amount controller 205 outputs a quantizing parameter indicating the decrease of a quantizing step size.

After the macro block encoding process of the step S304 is performed in this manner, it proceeds to the next step (Step S305). In the step S305, it determines whether or not the whole macro blocks in the target picture to be encoded are encoded. If it is not completed (N), it returns to the step S304 to continue the process. If the encoding of the whole macro blocks in the target picture to be encoded were completed (Step S305: Y), the picture complexity pic_x is updated with the following equation (13) depending on the decided entropy encoding mode selecting signal 232 (mode) at the end of the picture encoding (Step S306), and a series of the picture encoding process is completed (END).

$$pic\_x = \begin{cases} \lambda \times pic\_act\_rate \times qs\_pic & \text{... if } (mode = VLC) \\ pic\_act\_rate \times qs\_pic & \text{... Otherwise.} \end{cases} \quad (13)$$

In the equation, "pic_act_rate" is the occurring bit number of a picture which is encoded at that time. Furthermore, "qs_pic" is the average quantizing step size of the macro block of the picture which is encoded at that time. As already explained above, the picture complexity pic_x stores its value for each picture type.

As explained above, the image encoding apparatus 200 in accordance with the first embodiment of the present invention can generate a bit stream 207 by successively applying the processes to encode a picture as shown in FIG. 2 to externally inputted image data 201. That is, the following encoding processes are performed on each picture in the image encoding apparatus 200 of this embodiment.

(a) A case where the estimated symbol number corresponding to the assigned picture rate is equal to or less than the symbol number for which the arithmetic encoder can process within the predetermined time period in the processes before the step S303. In this case, the encoding is performed by the CABAC device 242 in the entropy encoder 215 as a usual case.

(b) A case where the estimated symbol number corresponding to the assigned picture rate is larger than the symbol number for which the arithmetic encoder can process within the predetermined time period, and the image quality by the CABAC device 242 which is restricted by the bit number corresponding to the symbol number for which the arithmetic encoder can process within the predetermined time period is better than the image quality of the VLC device 243 in the processes before the step S303.

In this case, the encoding is performed by the CABAC device 242 which is restricted by the assigned picture rate corresponding to the symbol number for which the arithmetic encoder can process within the predetermined time period.

(c) The other case, namely, a case where the estimated symbol number corresponding to the assigned picture rate is larger than the symbol number for which the arithmetic encoder can process within the predetermined time period, and the image quality by the CABAC device 242 which is restricted by the bit number corresponding to the symbol number for which the arithmetic encoder can process within the predetermined time period is worse than the image quality of the VLC device 243 in the processes before the step S303.

In this case, the encoding is performed by the VLC device 243.

As explained above, the image encoding apparatus 200 of this embodiment can minimize image degradation, control a code amount in units smaller than pictures, and ensure that encoding of the picture is completed within a certain time period.

Second Embodiment

Figure 3:
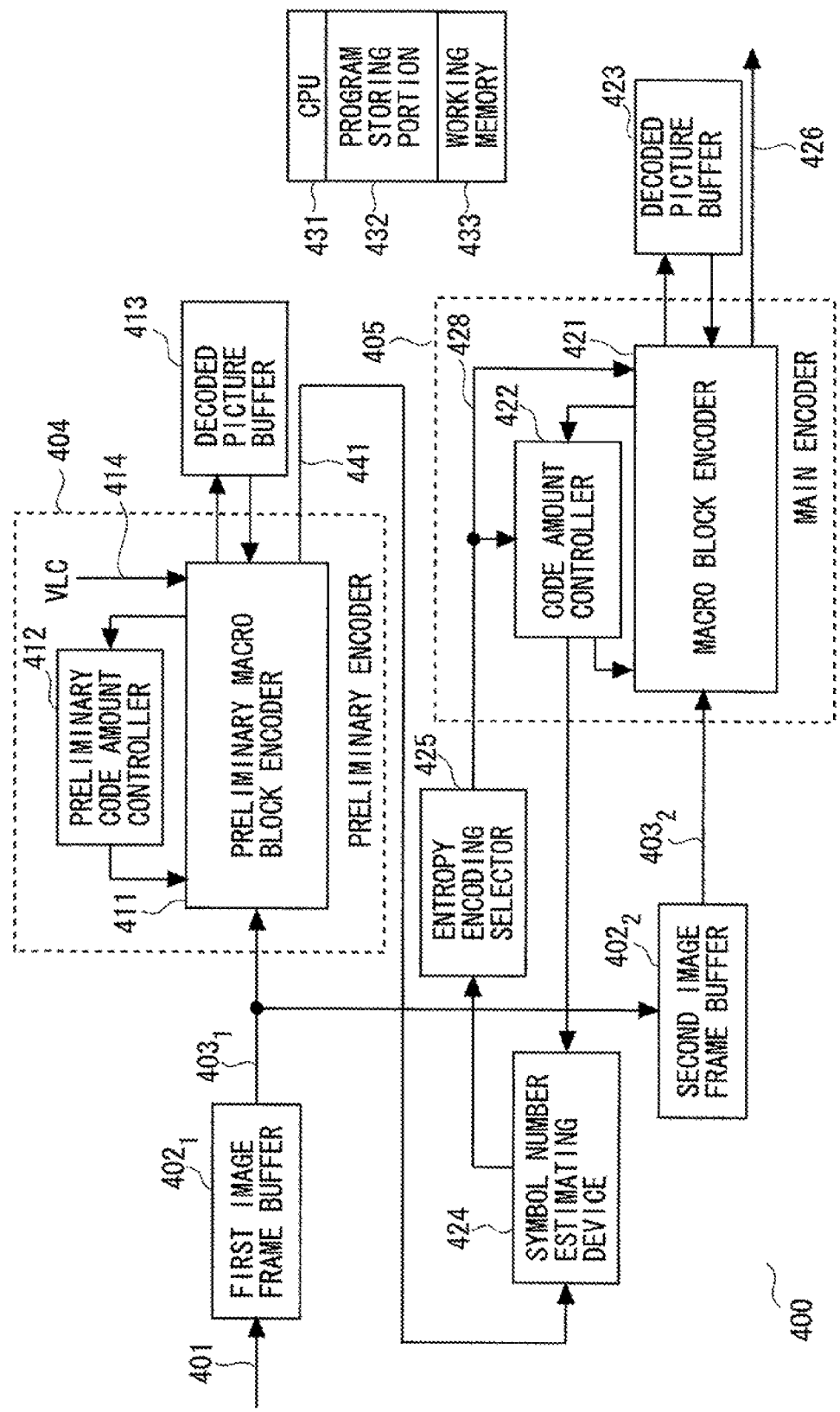
FIG. 3 is a block diagram showing the structure of an image encoding apparatus in accordance with a second embodiment of the present invention.

FIG. 3 shows the structure of an image encoding apparatus in accordance with a second embodiment of the present invention. An image encoding apparatus 400 in accordance with a second embodiment includes a first image frame buffer 402$_1$ to successively store target image data 401 to be compressed. A first image data 403$_1$ which is outputted from this first image frame buffer 402$_1$ in units of macro blocks is inputted to a preliminary encoder 404 and a second image frame buffer 402$_2$. A second image data 403$_2$ which is outputted from the second image frame buffer 402$_2$ in units of macro blocks is inputted to a main encoder 405.

The preliminary encoder 404 includes a preliminary macro block encoder 411 to receive the first image data 403$_1$, and a preliminary code amount controller 412 connected to the preliminary macro block encoder 411. Furthermore, a decoded picture buffer 413 is arranged on the outside of the preliminary encoder 404 and connected to the preliminary macro block encoder 411. Furthermore, a VLC device selecting signal 414 is supplied to the preliminary macro block encoder 411.

The main encoder 405 includes a macro block encoder 421 and a code amount controller 422 connected to the macro block encoder 421. A decoded picture buffer 423 connected to the macro block encoder 421, and a symbol number estimating device 424 and a entropy encoding selector 425 both of which are connected to the code amount controller 422 are arranged on the outside of the main encoder 405. The macro block encoder 421 outputs an encoded bit stream 426.

The image encoding apparatus 400 in accordance with the second embodiment includes a CPU 431, a program storing portion 432 such as a disk drive and an optical disk to store a control program executed by this CPU 431, and a working memory 433 such as semiconductor memory to temporally store various data during the time when the CPU 431 is executing the control program stored in the program storing portion 432. At least some part of the components shown in FIG. 3 may be achieved by software operations by the CPU 431 executing the control program stored in the program storing portion 432.

The image encoding apparatus 400 of the second embodiment has the combined circuit structure of the image encoding apparatus 100 shown in FIG. 9 and the image encoding apparatus 200 in accordance with the first embodiment of the present invention. That is, the preliminary macro block encoder 411 has the same circuit structure as that of the macro block encoder 104 shown in FIG. 9. Specifically, the first image data 403 outputted from the first image frame buffer 402$_1$ shown in FIG. 3 is supplied to the same circuit (not shown) in the preliminary macro block encoder 411 as the macro block buffer 111 shown in FIG. 9. The preliminary code amount controller 412 has the same circuit as the code amount controller 105 shown in FIG. 9, and is connected to the conversion and quantization device (not shown) and the entropy encoder (not shown) (both of which are the same as the conversion and quantization device 114 and entropy encoder 115 respectively in the FIG. 9). A bit stream 441 outputted from the entropy encoder (not shown), which is encoded in the same manner as the bit stream 107 outputted from the entropy encoder 115 shown in FIG. 9, is outputted to the outside of the preliminary macro block encoder 411 and inputted to the symbol number estimating device 424. Furthermore, the decoded picture buffer 413 which is identical to the decoded picture buffer 106 shown in FIG. 9 is connected to the adder 117A (not shown) and predicting device 112A (not shown) (which are identical to the adder 117 and predicting device 112 respectively in FIG. 9).

However, this embodiment is different from the structure shown in FIG. 9 in that while the entropy encoding mode selecting signal 132 is supplied to the entropy encoder 115 shown in FIG. 9, the VLC device selecting signal 414 is supplied to the entropy encoder in this embodiment. In this manner, in the preliminary encoder 404 of this embodiment, it is set to select the VLC device (not shown) which corresponds to the VLC device 143 (FIG. 11) in which the entropy encoding process is always completed within a certain time period. Incidentally, it is also possible to select the CABAC device (not shown) which corresponds to the CABAC device 142 (FIG. 12) instead of the VLC device. However, in such case, the bin number needs to be monitored to control the code amount such that the arithmetic encoding is completed within a predetermined time period.

Meanwhile, the macro block encoder 421 of the main encoder 405 has the same structure as that of the macro block encoder 204 shown in FIG. 1. That is, the second image data 403$_2$ outputted from the second image frame buffer 402$_2$ is inputted to the macro block buffer 211A (not shown) corresponding to the macro block buffer 211 shown in FIG. 1 in units of macro blocks in similar manner to the image data 203 in FIG. 1. Furthermore, similar to the code amount controller 205 shown in FIG. 1, the code amount controller 422 is connected the conversion and quantization device 214A (not shown) corresponding to the conversion and quantization device 214 and the entropy encoder 215A (not shown) corresponding to the entropy encoder 215. Furthermore, similar to the decoded picture buffer 206 shown in FIG. 1, the decoded picture buffer 423 is connected the predicting device 212A (not shown) corresponding to the predicting device 212 and the inverse-conversion and inverse-quantization device 216A (not shown) corresponding to the inverse-conversion and inverse-quantization device 216. Then, the entropy encoder 215A corresponding to the entropy encoder 215 shown in FIG. 1 outputs a bit stream 426 corresponding to the bit stream 207 in FIG. 1.

With these structures of the image encoding apparatus 400 of this embodiment, the preliminary encoder 404 successively encodes macro blocks of the target picture to be encoded, which are outputted from the first image frame buffer 402$_1$, and output a bit stream 441. The bit number of the bit stream 441 outputted from the preliminary encoder 404 is called "preceding encoding information" in the specification.

The decoded picture buffer 413 stores decoded images from the preliminary encoder 404, and manages decoded image pictures reconstructed from the decoded images.

The symbol number estimating device 424 which has the same structure as the symbol number estimating device 208 shown in FIG. 1 counts the bit number of a bit stream 441 supplied from the preliminary encoder 404. Then, after the preliminary encoder 404 completes the encoding (preliminary encoding) of the whole macro blocks, it estimates the bin number of the macro blocks of the target picture to be encoded, i.e., the total bin number of a plurality of the macro blocks constituting the picture based on this counted bit number.

The entropy encoding selector 425 which has the same structure as the entropy encoding selector 210 shown in FIG. 1 brings the entropy encoding mode selecting signal 428 to one of the states using the above-mentioned bin number estimated by the symbol number estimating device 424. The code amount controller 422 establishes a assigned picture rate based on the state of the entropy encoding mode selecting signal 428 selected by the entropy encoding selector 425.

After the preliminary encoder 404 completes the encoding of the whole macro blocks, the second image frame buffer 402$_2$ reads the target image to be encoded from the first image frame buffer 402$_1$, and prepares for the start of the encoding (main encoding) of the target picture to be encoded.

The main encoder 405 which is composed of the macro block encoder 421 and code amount controller 422 successively encodes macro blocks of the target picture to be encoded of the second image frame buffer 402$_2$, and output a bit stream 426.

The overall operation of the image encoding apparatus 400 of the second embodiment is briefly explained hereinafter.

The image encoding apparatus 400 performs the main encoding of a target picture to be encoded by operating the first image frame buffer 402$_1$ and preliminary macro block encoder 411 at the start of the picture encoding. After the preliminary encoding of the target picture to be encoded, the image encoding apparatus 400 determines the entropy encoding mode selecting signal 428 by operating the symbol number estimating device 424 and entropy encoding selector 425 at the start of the picture encoding. The image encoding apparatus 400 of updates an assigned picture rate by operating the code amount controller 422 after the decision of the entropy encoding mode selecting signal 428 and before the start of the main encoding of macro blocks of the target picture to be encoded. After the picture rate update, the image encoding apparatus 400 performs the main encoding of macro blocks of the target picture to be encoded by operating the second image frame buffer 402$_2$ and main encoder 405. After the whole macro blocks within the picture are encoded, the image encoding apparatus 400 performs predetermined processes and starts the encoding of the next picture.

Figure 4:
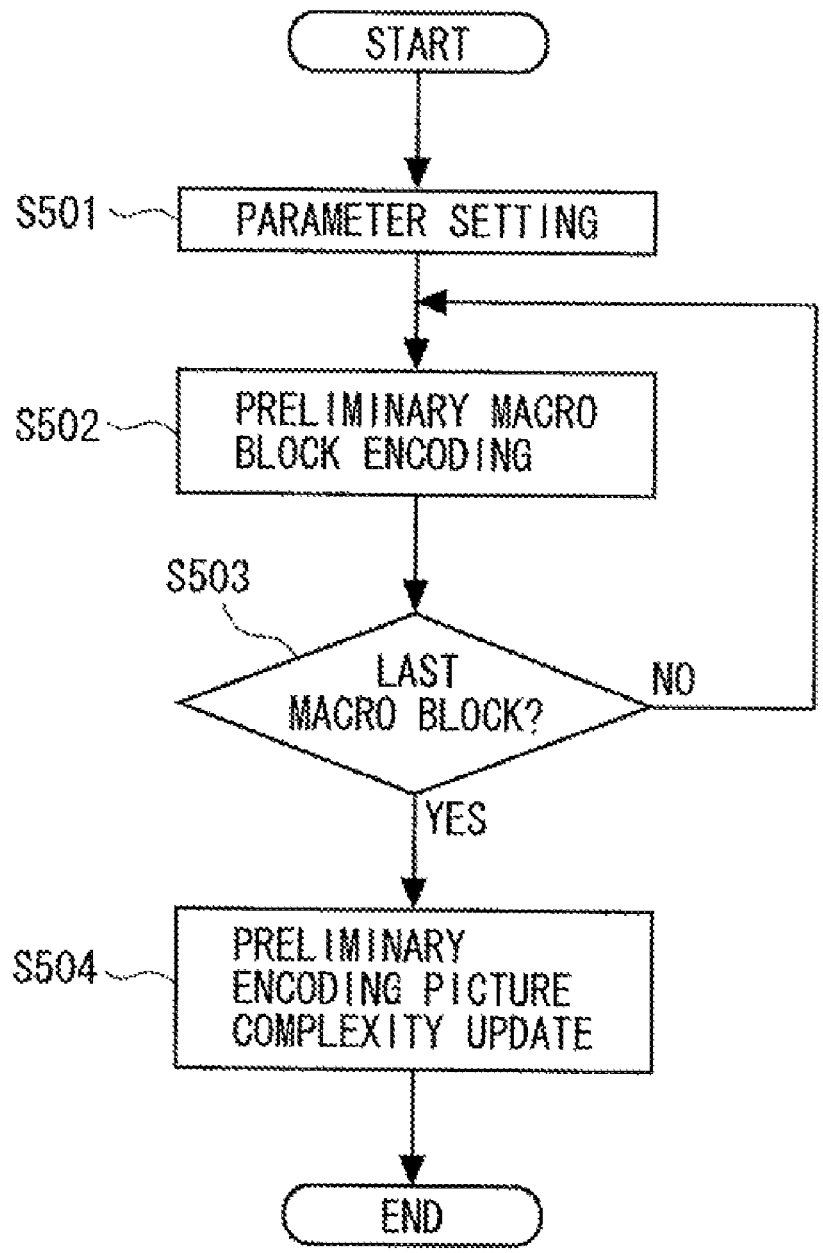
FIG. 4 is a flowchart showing the operation of the image encoding apparatus in accordance with the second embodiment for preliminary picture encoding.

FIG. 4 shows the operation of the image encoding apparatus for preliminary picture encoding. The following explanation is made with reference to FIG. 3.

At the start of the preliminary encoding of a picture, an assigned picture rate of the preliminary picture encoding pre_pic_rate is established at the preliminary code amount controller 412 (Step S501). The quantizing step size qs_rc to achieve this assigned picture rate pre_pic_rate can be calculated with the following equation (14).

$$qs\_rc = \lambda \times pic\_x / pre\_pic\_rate \tag{14}$$

After the parameter is established in this manner, the preliminary encoder 404 performs the preliminary encoding of one macro block of a target picture to be encoded by using the above-mentioned VLC device which corresponds to the VLC device 143 (FIG. 11) as an entropy encoding mode (Step S502). Next, the preliminary encoder 404 determines whether or not the whole macro blocks in the target picture to be encoded are encoded (Step S503). If the preliminary encoding is not completed (N), it returns to the step S502 to continue the process.

On the other hand, if the preliminary encoding were completed (Step S503: Y), the preliminary picture encoding complexity pre_pic_x is updated with the following equation (15), and the preliminary picture encoding process is completed (END).

$$pre\_pic\_x = pic\_act\_rate \times qs\_pic \tag{15}$$

In the equation, "pic_act_rate" is the occurring bit number of a picture which is encoded at that time, and "qs_pic" is the average quantizing step size of the macro block of the picture which is encoded at that time.

Figure 5:
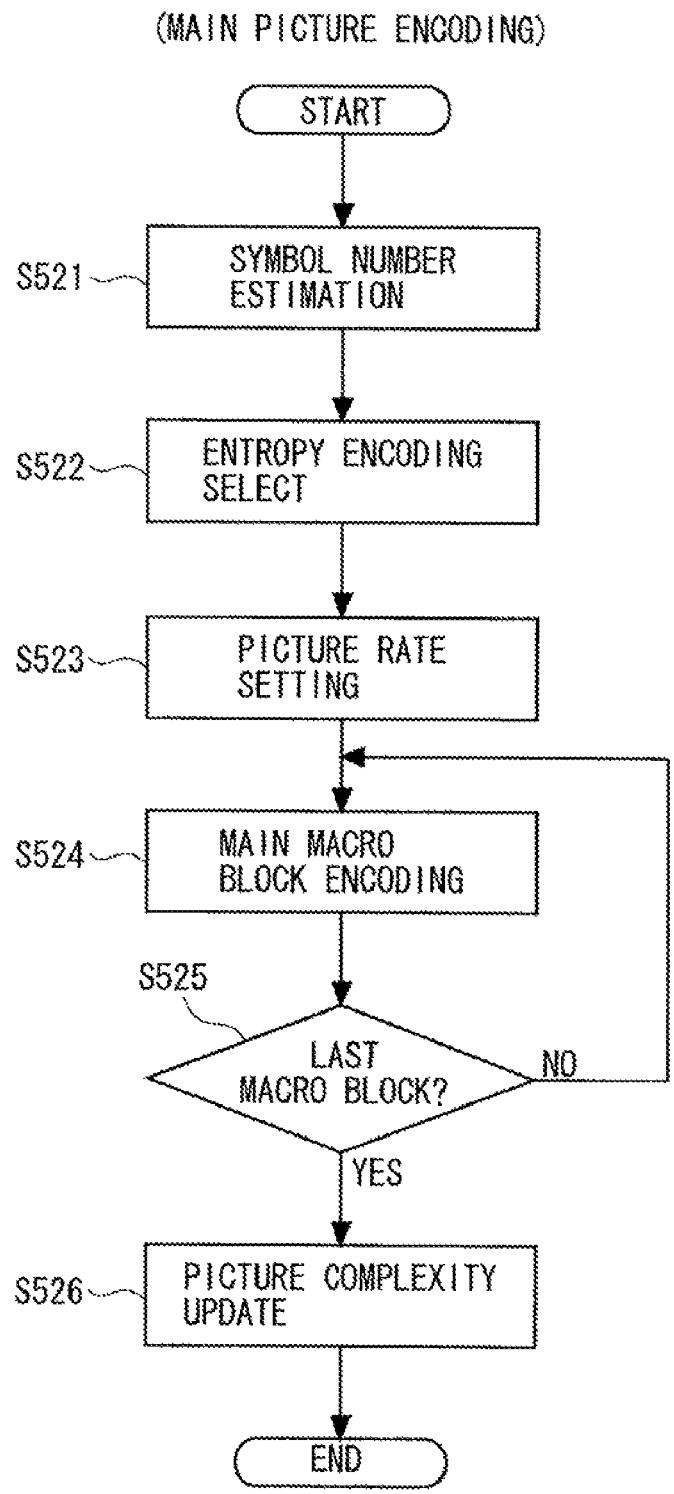
FIG. 5 is a flowchart showing the operation of the image encoding apparatus in accordance with the second embodiment for main picture encoding.

FIG. 5 shows the operation of the image encoding apparatus for main picture encoding. The following explanation is made with reference to FIG. 3.

At the start of the main encoding of the picture, the second image frame buffer 402$_2$ reads the target picture to be encoded which is stored in the first image frame buffer 402$_1$. The symbol number estimating device 424 calculates an estimated bin number with the following equation (16) using the preliminary encoding picture complexity pre_pic_x which is updated at the step S503 in FIG. 4 (Step S521). As explained above, it may be recalculated from the above-mentioned equation (15) by counting the bit number of the bit stream 441 supplied from the preliminary encoder 404 for each macro block.

$$epic\_bin = \frac{v}{\lambda} \times pre\_pic\_x / qs\_rc \tag{16}$$

In the equation, "qs_rc" is calculated from the following equation (17).

$$qs\_rc = pic\_x / pic\_rate \tag{17}$$

After the symbol number is estimated in this manner, the entropy encoding selector 425 selects an entropy encoding mode using the estimated bin number of the target picture to be encoded epic_bin (Step S522).

Firstly, it calculates the average quantizing step size qs_cabac using the above-mentioned equation (7) for the case where the target picture is encoded by the CABAC device (not shown) which corresponds to the CABAC device 142 (FIG. 12).

In the equation, similar to the first embodiment, "qs_cabac" is the image quality by the CABAC device under the condition where the upper limit bit number is imposed by the processible bin number within a predetermined time period. The smaller the value "qs_cabac", the better the image quality becomes.

Then, it calculates the average quantizing step size qs_vlc using the above-mentioned equation (9) for the case where the target picture is encoded by the VLC device. Similar to the first embodiment, the average quantizing step size qs_vlc is the image quality by the VLC device under the condition where the reduction in compression efficiency of the VLC device is imposed.

Finally, the entropy encoding mode selecting signal 428 (mode) is determined with the equation (10) using the average quantizing step size qs_cabac and average quantizing step size qs_vlc.

After the step S522 is completed in this manner, the code amount controller 422 updates the assigned picture rate of the target picture to be encoded pic_rate based on the entropy encoding mode selecting signal 428 (mode) using the above-mentioned equation (11).

Incidentally, the quantizing step size qs_rc to achieve the assigned picture rate pic_rate can be calculated with the above-mentioned equation (12).

After the step S523 is completed in this manner, the main encoder 405 performs the main encoding of one macro block of the target picture to be encoded using the decided entropy encoding mode selecting signal 428 (mode) (Step S524).

At this point, similar to the first embodiment, the code amount controller 422 monitors a bit stream 107A (not shown) outputted from the entropy encoder 215A which corresponds to the entropy encoder 115 shown in FIG. 9. Then, if the bit number of the outputted bit stream 107A is larger than the assigned picture rate, it outputs a quantizing parameter indicating the increase of a quantizing step size. On the other hand, if the bit number of the outputted bit stream 107A is smaller than the assigned picture rate, it outputs a quantizing parameter indicating the decrease of a quantizing step size.

After the step S524 is completed in this manner, the main encoder 405 determines whether or not the whole macro blocks in the target picture to be encoded are encoded (Step S525). If it is not completed, it returns to the step S524 to continue the process.

On the other hand, if the main encoding of the whole macro blocks in the target picture to be encoded were completed (Step S525: Y), the picture complexity pic_x is updated with the above-mentioned equation (13) depending on the decided entropy encoding mode selecting signal 428 (mode) (Step S306), the main picture encoding process is completed (END).

In the equation (13), "pic_act_rate" is the occurring bit number of a picture which is encoded at that time, and "qs_pic" is the average quantizing step size of the macro block of the picture which is encoded at that time. As already explained above, the picture complexity pic_x stores its value for each picture type.

As explained above, the image encoding apparatus 400 in accordance with the second embodiment of the present invention can generate a bit stream 426 by successively applying the processes to encode a picture to an externally inputted image data 401. Moreover, since it can use the preliminary information by the preliminary encoder 404 which uses the VLC, the main encoder 405 can estimate the bin number of the image of a target picture to be encoded more accurately than the first embodiment. In this manner, it can make image degradation smaller than the image encoding apparatus 200 of the first embodiment, and ensure that encoding of the picture is completed within a certain time period.

Third Embodiment

Figure 6:
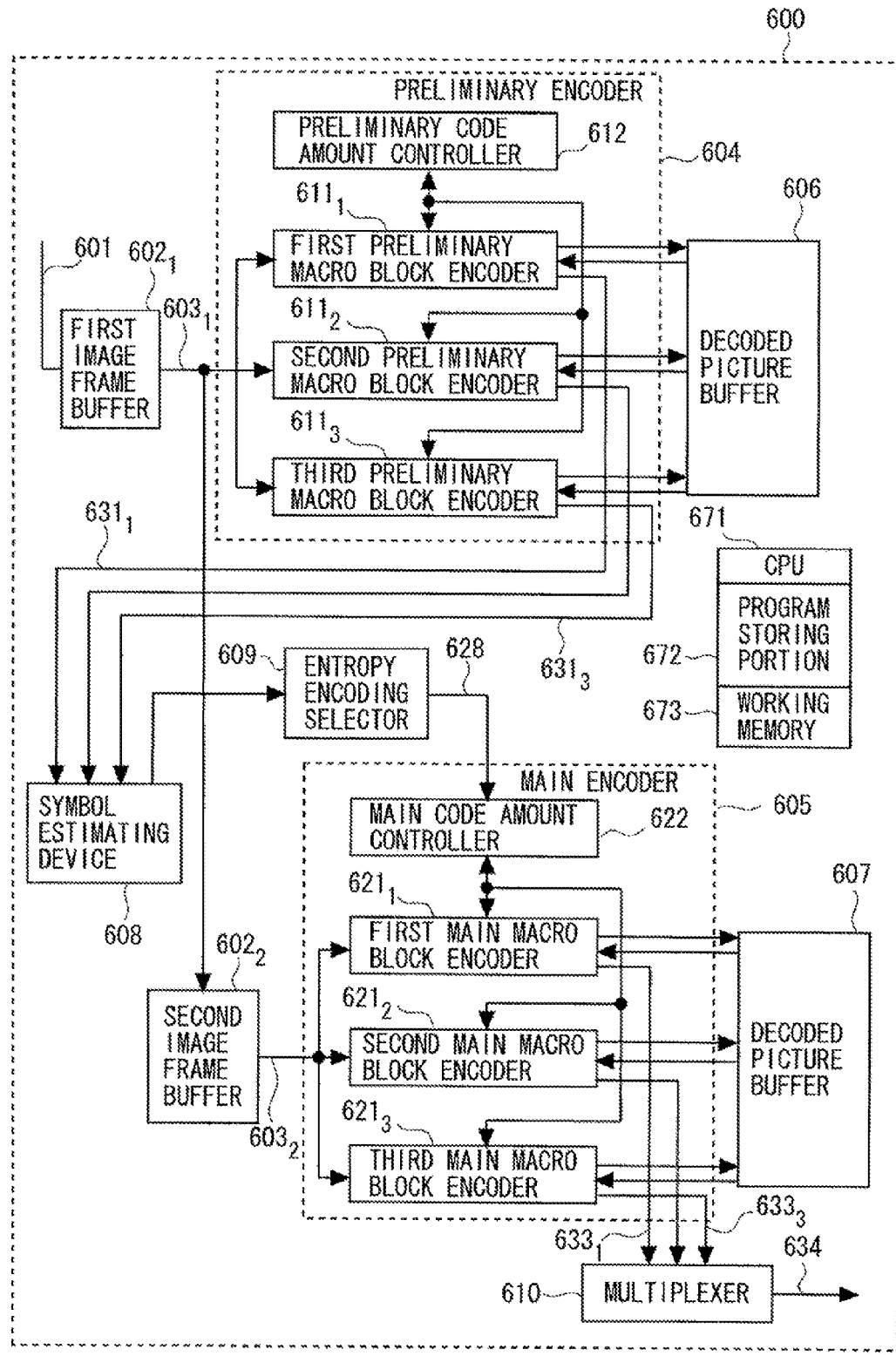
FIG. 6 is a block diagram showing the structure of an image encoding apparatus in accordance with a third embodiment of the present invention.

FIG. 6 shows the structure of an image encoding apparatus in accordance with a third embodiment of the present invention. In the example of the second embodiment explained above, one picture is encoded by using one pair of the preliminary macro block encoder 411 and macro block encoder 421 as shown in FIG. 3. An image encoding apparatus 600 in accordance with a third embodiment of the present invention encodes one picture by using several pairs of a preliminary macro block encoder and a macro block encoder.

FIG. 6 shows one example in which one picture is encoded by using three pairs of a preliminary macro block encoder and a macro block encoder. The image encoding apparatus 600 includes a first image frame buffer 602$_1$ to successively store target image data 601 to be compressed. A first image data 603$_1$ which is outputted from this first image frame buffer 602$_1$ in units of macro blocks is inputted to a preliminary parallel encoder 604 and a second image frame buffer 602$_2$. A second image data 603$_2$ which is outputted from the second image frame buffer 602$_2$ in units of macro blocks is inputted to a main parallel encoder 605.

The preliminary parallel encoder 604 includes first to third preliminary macro block encoders 611$_1$-611$_3$, each of which has the same structure as the preliminary macro block encoder 411 of the second embodiment, and a preliminary code amount controller 612 which operates in the same manner as the preliminary code amount controller 412 of the second embodiment. A first image data 603$_1$ which is outputted from the first image frame buffer 602$_1$ in units of macro blocks is inputted in parallel to the first to third preliminary macro block encoders 611$_1$-611$_3$ in the preliminary parallel encoder 604. The first to third preliminary macro block encoders 611$_1$-611$_3$ are arranged on the outside of the preliminary parallel encoder 604, and connected to a decoded picture buffer 606 corresponding to the decoded picture buffer 413 of the second embodiment.

The main parallel encoder 605 includes first to third main macro block encoders 621$_1$-621$_3$, each of which has the same structure and operates in the same manner as the entropy encoding selector 425 of the second embodiment, and a main code amount controller 622 which corresponds to the code amount controller 422 of the second embodiment. A second image data 603$_2$ which is outputted from the second image frame buffer 602$_2$ in units of macro blocks is inputted in parallel to the first to third main macro block encoders 621$_1$-621$_3$ in the main parallel encoder 605. The first to third main macro block encoders 621$_1$-621$_3$ are arranged on the outside of the main parallel encoder 605, and connected to a decoded picture buffer 607 corresponding to the decoded picture buffer 423 of the second embodiment.

Encoded bit streams 631$_1$-631$_3$ outputted from the first to third preliminary macro block encoders 611$_1$-611$_3$ respectively in the preliminary parallel encoder 604 are inputted to a symbol estimating device 608 corresponding to the symbol number estimating device 424 of the second embodiment to perform a symbol estimating process. A bin number obtained by the symbol estimating device 608 is inputted to an entropy encoding selector 609 corresponding to the entropy encoding selector 425 of the second embodiment, and a bit stream outputted from the entropy encoding selector 609 is supplied to the main code amount controller 622.

Furthermore, first to third bit streams $633_1$-$633_3$ outputted from the first to third main macro block encoders $621_1$-$621_3$ respectively in the main parallel encoder 605 are inputted to a multiplexer 610. The multiplexer 610 multiplexes the first to third bit streams $633_1$-$633_3$, and outputs a bit stream 634.

The image encoding apparatus 600 in accordance with the third embodiment includes a CPU 671, a program storing portion 672 such as a disk drive and an optical disk to store a control program executed by this CPU 671, and a working memory 673 such as semiconductor memory to temporally store various data during the time when the CPU 671 is executing the control program stored in the program storing portion 672. At least some part of the components shown in FIG. 6 may be achieved by software operations by the CPU 671 executing the control program stored in the program storing portion 672.

Each of the first to third preliminary macro block encoders $611_1$-$611_3$ encodes their respective image portions of a target picture to be encoded of the first image frame buffer $602_1$ after the picture is divided into the three image portions. For example, assume that the image signal format of a target picture to be encoded is the above-mentioned QCIF. In such case, the first preliminary macro block encoder $611_1$ encodes the first successive 33 macro blocks (in order of raster scanning). Then, the second preliminary macro block encoder $611_2$ encodes the next successive 33 macro blocks, and the third preliminary macro block encoder $611_3$ encodes the final successive 33 macro blocks.

The preliminary parallel encoder 604 encodes three macro blocks of the target picture to be encoded of the first image frame buffer $602_1$ in parallel at a time. Then, it outputs the first to third bit streams $633_1$-$633_3$ from the first to third preliminary macro block encoders $611_1$-$611_3$. At this point, in the preliminary parallel encoder 604, it is set to select the VLC device (not shown) in which the entropy encoding process is always completed within a certain time period. It is also possible to select the CABAC device (not shown) instead of the VLC device. However, in such case, the bin numbers of their respective first to third preliminary macro block encoders $611_1$-$611_3$ need to be monitored to control the code amounts such that all the arithmetic encodings in these first to third preliminary macro block encoders $611_1$-$611_3$ are completed within a predetermined time period.

Incidentally, the bit numbers of bit streams outputted from the preliminary parallel encoder 604 are called "preceding encoding information" in the specification. Furthermore, the decoded picture buffer 606 stores decoded images from the preliminary parallel encoder 604, and manages decoded image pictures reconstructed from the decoded images.

The symbol estimating device 608 counts the bit numbers of bit streams $631_1$-$631_3$ of the first to third preliminary macro block encoders $611_1$-$611_3$ supplied from the preliminary parallel encoder 604. Then, after the preliminary parallel encoder 604 completes the encoding of the whole macro blocks, i.e., the preliminary encoding, it estimates the bin numbers of the divided images for which their respective first to third main macro block encoders $621_1$-$621_3$ will perform the encoding based on their respective bit numbers. In the above-mentioned example, each of the first to third main macro block encoders $621_1$-$621_3$ estimates the bin numbers for their respective 33 macro blocks. In general, it estimates the total bin number of a plurality of macro blocks constituting a divided image.

The entropy encoding selector 609 selects an entropy encoding mode using each estimated bin number of the symbol estimating device 608. The main code amount controller 622 establishes an assigned picture rate based on the entropy encoding mode selecting signal 628 established by the entropy encoding selector 609. Furthermore, as explained in detail later, the macro block minimum quantizing parameter (which is also called "macro block minimum QP" in this specification) is calculated such that each of the first to third main macro block encoders $621_1$-$621_3$ completes the entropy encoding within a predetermined time period.

After the preliminary parallel encoder 604 completes the encoding of the whole macro blocks, the second image frame buffer $602_2$ reads the target image to be encoded from the first image frame buffer $602_1$, and prepares for the start of the encoding of the target picture to be encoded.

The first main macro block encoder $621_1$ which corresponds to the first preliminary macro block encoder $611_1$ encodes a divided image of the image in the second image frame buffer $602_2$. Likewise, the second main macro block encoder $621_2$ which corresponds to the second preliminary macro block encoder $611_2$ encodes the corresponding divided image of the image in the second image frame buffer $602_2$, and the third main macro block encoder $621_3$ which corresponds to the third preliminary macro block encoder $611_3$ encodes the corresponding divided image of the image in the second image frame buffer $602_2$.

The main parallel encoder 605 encodes three macro blocks of the target picture to be encoded of the second image frame buffer $602_2$ in parallel at a time. Then, it outputs the first to third bit streams $633_1$-$633_3$ as bit streams of the first to third main macro block encoders $621_1$-$621_3$ respectively. However, the first to third main macro block encoders $621_1$-$621_3$ perform entropy encoding with the entropy encoding mode established through the main code amount controller 622. Furthermore, the first to third main macro block encoders $621_1$-$621_3$ perform the encoding while compensating the quantizing parameter supplied from the main code amount controller 622 using the macro block minimum qp established through the main code amount controller 622. The multiplexer 610 multiplexes the first to third bit streams $633_1$-$633_3$ outputted from the first to third main macro block encoders $621_1$-$621_3$, and outputs it externally.

The overall operation of the image encoding apparatus 600 of the third embodiment is briefly explained hereinafter. The image encoding apparatus 600 performs the main encoding of a target picture to be encoded by operating the first image frame buffer $602_1$ and preliminary parallel encoder 604 at the start of the picture encoding. After the preliminary encoding of the target picture to be encoded, the image encoding apparatus 600 determines an entropy encoding mode by the entropy encoding mode selecting signal 628 by operating the symbol estimating device 608 and entropy encoding selector 609 at the start of the picture encoding. The image encoding apparatus 600 updates an assigned picture rate and calculates the macro block minimum qp by operating the main code amount controller 622 after the decision of the entropy encoding mode and before the start of the main encoding of macro blocks of the target picture to be encoded. After the picture rate update, the image encoding apparatus 600 performs the main encoding of macro blocks of the target picture to be encoded by operating the second image frame buffer $602_2$ and main parallel encoder 605. After the whole macro blocks within the picture are encoded, the image encoding apparatus 600 performs predetermined processes and starts the encoding of the next picture.

Figure 7:
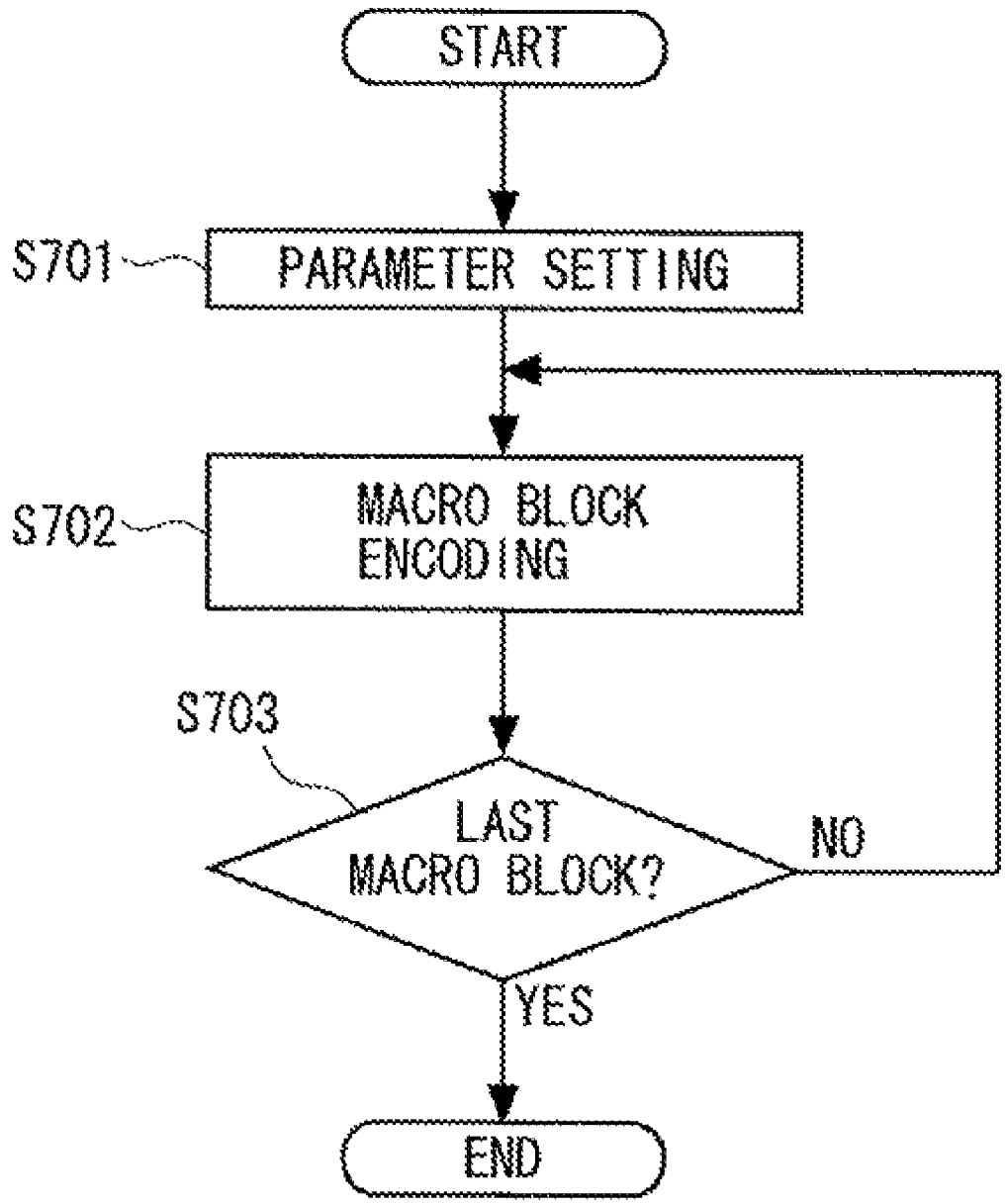
FIG. 7 is a flowchart showing the operation of the image encoding apparatus in accordance with the third embodiment for preliminary picture encoding.

FIG. 7 shows the operation of the image encoding apparatus for preliminary picture encoding. The following explanation is made with reference to FIG. 6.

At the start of the preliminary encoding of a picture, an assigned picture rate of the preliminary picture encoding pre_pic_rate is established at the preliminary parallel encoder 604 (Step S701). The quantizing step size qs_rc to achieve this assigned picture rate pre_pic_rate can be calculated with the above-mentioned equation (14).

After the parameter is established in this manner, the preliminary parallel encoder 604 performs the preliminary encoding of three macro blocks of a target picture to be encoded by using the above-mentioned VLC device which corresponds to the VLC device 143 (FIG. 11) as an entropy encoding mode (Step S702). Next, the preliminary parallel encoder 604 determines whether or not the whole macro blocks in the target picture to be encoded are encoded (Step S703). If the preliminary encoding is not completed (N), it returns to the step S702 to continue the process. On the other hand, if the preliminary encoding were completed (Step S703: Y), the preliminary picture encoding process is completed (END).

Figure 8:
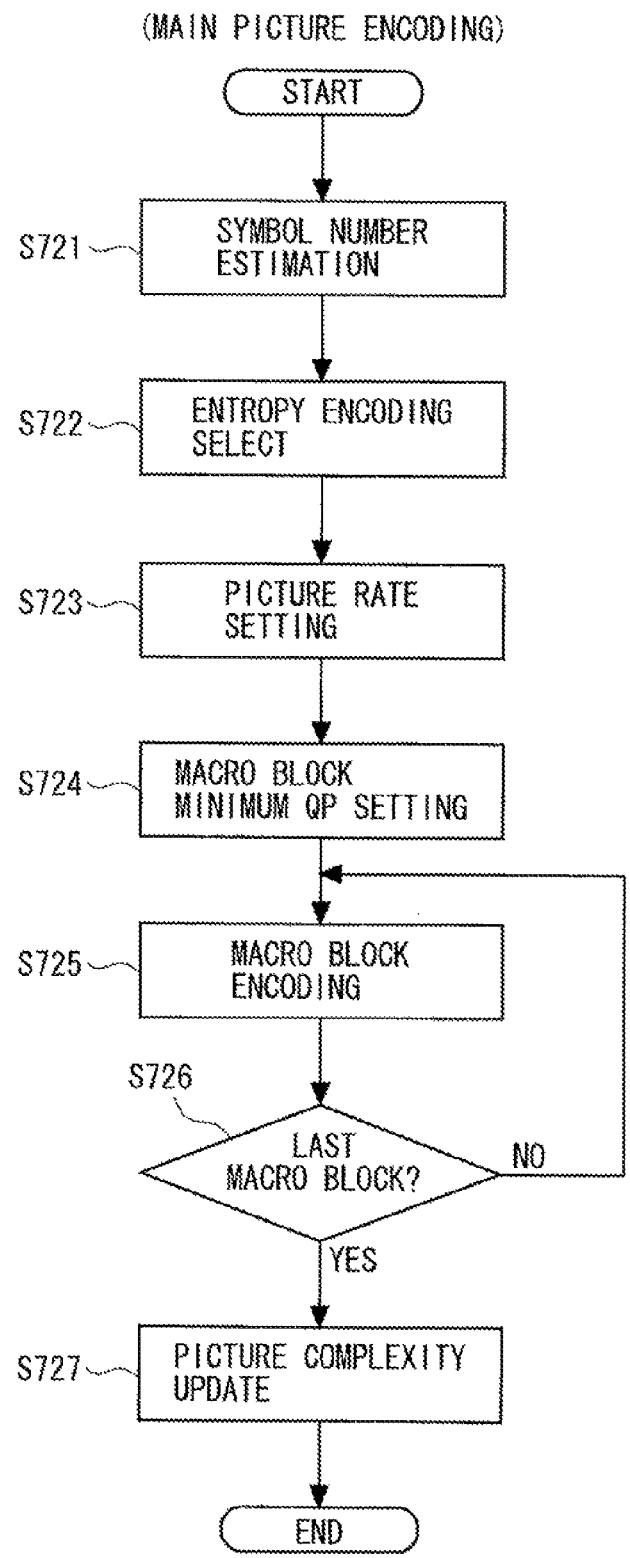
FIG. 8 is a flowchart showing the operation of the image encoding apparatus in accordance with the third embodiment for main picture encoding.

FIG. 8 shows the operation of the image encoding apparatus for main picture encoding. The following explanation is made with reference to FIG. 6.

At the start of the main encoding of the picture, the second image frame buffer 602$_2$ reads the target picture to be encoded which is stored in the first image frame buffer 602$_1$. The symbol estimating device 608 calculates the estimated bin numbers of the divided images for which their respective first to third main macro block encoders 621$_1$-621$_3$ will perform the encoding (e_bin[i], $0 \leq i \leq 2$) with the following equation (18) using the bit numbers of the first to third preliminary macro block encoders 611$_1$-611$_3$ (pre_rate[i], $0 \leq i \leq 2$).

$$e\_bin[i] = \frac{v}{\lambda} \times pre\_rate[i] / qs\_rc \quad (18)$$

In the equation, "qs_rc" is calculated from the above-mentioned equation (17).

After the symbol number is estimated in this manner, the entropy encoding selector 609 determines an entropy encoding mode using the estimated bin numbers of the divided images for which the first to third main macro block encoders 621$_1$-621$_3$ will perform the encoding e_bin[i] (Step S722).

Firstly, it calculates the average quantizing step size qs_cabac using the above-mentioned equation (7) for the case where the target picture is encoded by the CABAC device which corresponds to the CABAC device 142 (FIG. 12).

In the equation, "epic_bin" is calculated from the following equation (19).

$$epic\_bin = \sum_{i=0}^{2} e\_bin[i] \quad (19)$$

In the equation, "ppic_bin" is expressed by the above-mentioned equation (8).

As seen from these equations (7), (19) and (8), "qs_cabac" is the image quality by the CABAC device under the condition where the upper limit bit number is imposed by the average processible bin number within a predetermined time period.

Then, it calculates the average quantizing step size qs_vlc using the equation (9) for the case where the target picture is encoded by the VLC device.

Similar to the second embodiment, "qs_vlc" is the image quality by the VLC device under the condition where the reduction in compression efficiency of the VLC device is imposed.

Finally, it brings the entropy encoding mode selecting signal 628 to one of the states with the equation (10) using the average quantizing step size qs_cabac and average quantizing step size qs_vlc. With these operations, the step S722 is completed.

At the next step S723, the main code amount controller 622 updates the assigned picture rate of the target picture to be encoded pic_rate based on the entropy encoding mode selecting signal 628 (mode) using the equation (11).

Incidentally, the quantizing step size qs_rc to achieve the assigned picture rate pic_rate can be calculated with the equation (12).

After the process of the step S723 is completed, the main code amount controller 622 calculates the macro block minimum qp (mb_min_qp) with the following equation (29) at the next step S724.

$$mb\_min\_qp = \begin{cases} 0 & \text{... if (mode} = VLC) \\ qs2pq(qs) & \text{... Otherwise.} \end{cases} \quad (20)$$

In the equation, "qs", "max_emb_bin", "m_emb_bin" and "emb_bin[i]" are expressed by the following equations (21)-(24).

$$qs = \begin{cases} min\_qs & \text{... if (max\_emb\_bin} <= pmb\_bin) \\ \frac{m\_emb\_bin}{pmb\_bin} \times qs\_rc & \text{... Otherwise.} \end{cases} \quad (21)$$

$$max\_emb\_bin = \arg\max_i (emb\_bin[i]) \quad (22)$$

$$m\_emb\_bin = \arg\min_{i | emb\_bin[i] > pmb\_bin} (emb\_bin[i]) \quad (23)$$

$$emb\_bin[i] = ebin\_rate[i] / s\_mbs \quad (24)$$

Furthermore, the function qs2qp(x) is a function to calculates a quantizing parameter corresponding to a quantizing step size x, and "min_qs" is a quantizing step size corresponding to the minimum quantizing parameter (qp=0). From the calculation of the equation (20), the macro block minimum qp which is used as the restriction such that it does not exceeds the bin number for which the first to third main macro block encoders 621$_1$-621$_3$ can process within a predetermined time can be obtained.

After the process of the step S724 is completed, the main parallel encoder 605 encodes three macro blocks of the target picture to be encoded by using the decided entropy encoding mode selecting signal 628 at the next step S725.

Similar to the second embodiment, the main code amount controller 622 monitors a bit stream outputted from the above-mentioned entropy encoder 215A (not shown) which corresponds to the entropy encoder 115 shown in FIG. 9. Then, if the bit number of the outputted is larger than the assigned picture rate, it outputs a quantizing parameter indicating the increase of a quantizing step size. On the other hand, if the bit number of the bit stream outputted from the entropy encoder 215A is smaller than the assigned picture rate, it outputs a quantizing parameter indicating the decrease of a quantizing step size.

However, first to third main macro block encoders 621$_1$-621$_3$ perform the encoding while compensating the quantizing parameter supplied from the main code amount controller 622 mb_qp using the macro block minimum QP established through the main code amount controller 622.

$$qp = \begin{cases} mb\_min\_qp & \text{if } (qp <= mb\_min\_qp) \\ qp & \text{Otherwise.} \end{cases} \quad (25)$$

With this compensation, the number of bins which are inputted to the first to third main macro block encoders $621_1$-$621_3$ can be controlled such that they are all processed within a predetermined time period.

After the encoding process of macro blocks of the step S725 is completed in this manner, it determines whether or not the whole macro blocks in the picture for which the main encoding is performed are encoded (Step S726). If the encoding of macro blocks is not completed, it returns to the step S725 to continue the process.

If the main encoding of the whole macro blocks were completed, the picture complexity pic_x is updated with the equation (13) depending on the decided entropy encoding mode (mode) (Step S727), and the main picture encoding process is completed (END).

In the equation (13), "pic_act_rate" is the occurring bit number of a picture which is encoded at that time, i.e., the sum of the output bit numbers of the first to third main macro block encoders $621_1$-$621_3$, and "qs_pic" is the average quantizing step size of the macro block of the picture which is encoded at that time. The picture complexity pic_x at the step S727 stores its value for each picture type.

In accordance with the image encoding apparatus 600 of the third embodiment described above, it can establish an entropy encoding mode and a picture rate, for which the main parallel encoder 605 can achieve with its average processing capacity, based on the bit numbers of the bit streams of the first to third preliminary macro block encoders $611_1$-$611_3$ of the preliminary parallel encoder 604. Furthermore, the number of bins which are inputted to the first to third main macro block encoders $621_1$-$621_3$ can be controlled such that they are all processed within a predetermined time period by compensating the quantizing parameter of the first to third main macro block encoders $621_1$-$621_3$ based on the macro block minimum qp calculated from the bit streams of the first to third preliminary macro block encoders $611_1$-$611_3$. In this manner, even in the case where one picture is divided to several screens and they are encoded in parallel using several macro block encoders, the image encoding apparatus 600 can minimize image degradation, and ensure that encoding of a picture is completed within a certain time period.

The present invention is not limited to First to the third embodiments explained above, and various modifications can be made to the embodiments. For example, in the second embodiment, when the preliminary encoder 404 uses the CABAC device (not shown) to perform entropy encoding, the bin number can be used as substitute for the bit number, and still the same advantageous effects of the present invention is achieved.

INDUSTRIAL APPLICABILITY

The present invention is utilized, for example, in image encoding technology, in particular, encoding apparatus capable of selecting an entropy encoding scheme.

What is claimed is:

1. An image encoding apparatus comprising:
a code data generator to transform and quantize an image block to generate code data;
a variable length code encoder to encode the code data into bit-string data on the basis of applying variable length encoding;
an arithmetic encoder to encode the code data into bit-string data on the basis of converting the code data into binary symbols and applying binary arithmetic encoding;
a binary symbol number estimator to estimate the total number of the binary symbols that are converted from the code data generated from a plurality of image blocks of a target picture to be encoded; and
an encoding selector to select, for the encoding of the code data, either the variable length code encoder or the arithmetic encoder on the basis of the total number estimated by the binary symbol number estimator, wherein
the binary symbol number estimator:
obtains, for the plurality of image blocks of the target picture to be encoded, any one of a sum of activities, a sum of standard deviations, or a sum of variances, and
estimates the total number of the binary symbols by selecting a larger one of a first value and a second value,
the first value is a value obtained by dividing an estimated bin number complexity of the target picture to be encoded by a quantization step size obtained by dividing a product of a picture rate and an average quantizing step size of macro blocks of a lastly encoded picture associated with the same picture type as that of the target picture to be encoded by an assigned picture rate of the target picture to be encoded, wherein the estimated bin number complexity is estimated according to the equation epic_bin_x=α×pic_W+β, wherein:
epic_bin_x is the estimated bin number complexity of the target picture to be encoded,
pic_W is the any one of a sum of activities, a sum of standard deviations, or a sum of variances,
α is a gradient of a regression line of I picture bin number complexity for the one of a sum of activities, a sum of standard deviations, or a sum of variances, the I picture bin number complexity being, a product of a bin number and an average quantizing step size of macro blocks of an I picture,
β is an intercept of the regression line of the I picture bin number complexity for the one of a sum of activities, a sum of standard deviations, or a sum of variances, and
the second value is a product of an assigned picture rate of the target picture to be encoded and a symbol-to-bit ratio, wherein the symbol-to-bit ratio is a value obtained statistically from a plurality of pictures having a same type as that of the target picture to be encoded or a value obtained from a lastly encoded picture having a same picture type as that of the target picture to be encoded.

2. The image encoding apparatus according to claim 1 wherein the binary symbol number estimator estimates, on the basis of the total number, a quantization step size corresponding to the code data amount that the capability of the variable length code encoder meets, and a quantization step size corresponding to the code data amount that the capability of the arithmetic encoder meets; and
the encoding selector selects either the variable length code encoder or the arithmetic encoder that is associated with the smaller estimated quantization step size.

3. The image encoding apparatus according to claim 1 further comprising a threshold comparator to compare the total binary symbol number estimated by the binary symbol number estimator with a predetermined threshold value, wherein the encoding selector selects the variable length code
encoder if the threshold comparator determines that the
total number is larger than the predetermined threshold
value, and selects the arithmetic encoder otherwise.

4. The image encoding apparatus according to claim 3
wherein the threshold value is a value calculated from the
maximum capable binary symbol number that the arithmetic
encoder encodes within the encoding time of the plurality of
image blocks and from the compression ratio between the
binary symbol number and the number of the bit-string data of
the arithmetic encoder.

5. An image encoding method comprising:
transforming and quantizing an image block to generate
code data;
estimating the total number of the binary symbols that are
converted from the code data generated from a plurality
of image blocks of a target picture to be encoded; and
selecting the encoding method of the code data from variable length encoding and arithmetic encoding on the
basis of the total number estimated, the variable length
encoding being adapted to encode the code data into
bit-string data on the basis of applying variable length
encoding, and the arithmetic encoding being adapted to
encode the code data into bit-string data on the basis of
converting the code data into binary symbols and applying binary arithmetic encoding, wherein
the estimating the total number of the binary symbols comprises:
obtaining, for the plurality of image blocks of the target
picture to be encoded, any one of a sum of activities,
a sum of standard deviations, or a sum of variances,
and
estimating the total number of the binary symbols by
selecting a larger one of a first value and a second value,
the first value is a value obtained by an estimated bin
number complexity of the target picture to be encoded
by a quantization step size obtained by dividing a product of a picture rate and an average quantizing step size
of macro blocks of a lastly encoded picture associated
with the same picture type as that of the target picture to
be encoded by an assigned picture rate of the target
picture to be encoded, wherein the estimated bin number
complexity is estimated according to the equation
$epic\_bin\_x = \alpha \times pic\_W + \beta$, wherein:
$epic\_bin\_x$ is the estimated bin number complexity of
the target picture to be encoded,
$pic\_W$ is the any one of a sum of activities, a sum of
standard deviations, or a sum of variances,
$\alpha$ is a gradient of a regression line of I picture bin number
complexity for the one of a sum of activities, a sum of
standard deviations, or a sum of variances, the I picture bin number complexity being a product of a bin
number and an average quantizing step size of macro
blocks of an I picture,
$\beta$ is an intercept of the regression line of the I picture bin
number complexity for the one of a sum of activities,
a sum of standard deviations, or a sum of variances,
and
the second value is a product of an assigned picture rate of
the target picture to be encoded and a symbol-to-bit
ratio, wherein the symbol-to-bit ratio is a value obtained
statistically from a plurality of pictures having a same
type as that of the target picture to be encoded or a value
obtained from a lastly encoded picture having a same
picture type as that of the target picture to be encoded.

6. The image encoding method according to claim 5 further
estimating, on the basis of the total number, a quantization
step size corresponding to the code data amount that the
capability of the variable length encoding method meets, and
a quantization step size corresponding to the code data
amount that the capability of the arithmetic encoding method
meets; and
when selecting the encoding method of the code data,
selecting either the variable length encoding method or
the arithmetic encoding method that is associated with
the smaller estimated quantization step size.

7. The image encoding method according to claim 5 further
comparing the total binary symbol number estimated with a
predetermined threshold value, and
when selecting the encoding method of the code data,
selecting the variable length encoding method if the total
number is determined larger than the predetermined
threshold value, and selecting the arithmetic encoding
method otherwise.

8. The image encoding method according to claim 7
wherein the threshold value is a value calculated from the
maximum capable binary symbol number that the arithmetic
method encodes within the encoding time of the plurality of
image blocks and from the compression ratio between the
binary symbol number and the number of the bit-string data of
the arithmetic method.

9. A non-transitory computer-readable recording medium
recording an image encoding program to instruct a computer
to execute:
a code data generating process to transform and quantize
an image block to generate code data;
a binary symbol number estimating process to estimate the
total number of the binary symbols that are converted
from the code data generated from a plurality of image
blocks; and
an encoding selecting process to select the encoding
method of the code data from variable length encoding
and arithmetic encoding on the basis of the total number
estimated by the binary symbol number estimating process, the variable length encoding being adapted to
encode the code data into bit-string data on the basis of
applying variable length encoding, and the arithmetic
encoding being adapted to encode the code data into
bit-string data on the basis of converting the code data
into binary symbols and applying binary arithmetic
encoding, wherein
the binary symbol number estimating process:
obtains, for the plurality of image blocks of the target
picture to be encoded, any one of a sum of activities,
a sum of standard deviations, or a sum of variances,
and
estimates the total number of the binary symbols by
selecting a larger one of a first value and a second
value,
the first value is a value obtained by dividing an estimated
bin number complexity of the target picture to be
encoded by a quantization step size obtained by dividing
a product of a picture rate and an average quantizing step
size of macro blocks of a lastly encoded picture associated with the same picture type as that of the target
picture to be encoded by an assigned picture rate of the
target picture to be encoded, wherein the estimated bin
number complexity is estimated according to the equation $epic\_bin\_x = \alpha \times pic\_W + \beta$, wherein:
$epic\_bin\_x$ is the estimated bin number complexity of
the target picture to be encoded,
$pic\_W$ is the any one of a sum of activities, a sum of
standard deviations, or a sum of variances, α is a gradient of a regression line of I picture bin number complexity for the one of a sum of activities, a sum of standard deviations, or a sum of variances, the I picture bin number complexity being a product of a bin number and an average quantizing step size of macro blocks of an I picture, β is an intercept of the regression line of the I picture bin number complexity for the one of a sum of activities, a sum of standard deviations, or a sum of variances, and the second value is a product of an assigned picture rate of the target picture to be encoded and a symbol-to-bit ratio, wherein the symbol-to-bit ratio is a value obtained statistically from a plurality of pictures having a same type as that of the target picture to be encoded or a value obtained from a lastly encoded picture having a same picture type as that of the target picture to be encoded.

10. The computer-readable recording medium according to claim 9 wherein the binary symbol number estimating process estimates, on the basis of the total number, a quantization step size corresponding to the code data amount that the capability of by using the variable length encoding method meets, and a quantization step size corresponding to the code data amount that the capability of the arithmetic encoding method meets; and the encoding selecting process selects either the variable length encoding method or the arithmetic encoding method that is associated with the smaller estimated quantization step size.

11. The computer-readable recording medium according to claim 9, wherein the program further instructing a computer to execute a threshold comparing process to compare the total binary symbol number estimated by the binary symbol number estimating process with a predetermined threshold value, wherein the encoding selecting process selects the variable length encoding method if the threshold comparing process determines that the total number is larger than the predetermined threshold value, and selects the arithmetic encoding method otherwise.

12. The computer-readable recording medium according to claim 11 wherein the threshold value is a value calculated from the maximum capable binary symbol number that the arithmetic method encodes within the encoding time of the plurality of image blocks and from the compression ratio between the binary symbol number and the number of the bit-string data of the arithmetic method.

* * * * *